US012652824B2

(12) United States Patent
Narita

(10) Patent No.: US 12,652,824 B2
(45) Date of Patent: Jun. 9, 2026

(54) INSULATED GATE SEMICONDUCTOR DEVICE

(71) Applicant: FUJI ELECTRIC CO., LTD., Kawasaki (JP)

(72) Inventor: Syunki Narita, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 658 days.

(21) Appl. No.: 18/070,946

(22) Filed: Nov. 29, 2022

(65) Prior Publication Data

US 2023/0092965 A1     Mar. 23, 2023

Related U.S. Application Data

(63) Continuation of application No. PCT/JP2021/039508, filed on Oct. 26, 2021.

(30) Foreign Application Priority Data

Dec. 24, 2020  (JP) ................................. 2020-215372
Jun. 10, 2021  (JP) ................................. 2021-097196

(51) Int. Cl.
*H10D 30/66*       (2025.01)
*H10D 62/10*       (2025.01)
*H10D 62/17*       (2025.01)

(52) U.S. Cl.
CPC ......... *H10D 30/668* (2025.01); *H10D 62/127* (2025.01); *H10D 62/393* (2025.01)

(58) Field of Classification Search
CPC ............... H10D 30/668; H10D 62/127; H10D 62/393
See application file for complete search history.

(56) References Cited

U.S. PATENT DOCUMENTS 9,954,054  B2    4/2018  Shiomi
10,199,493  B2    2/2019  Kinoshita et al.
(Continued)

FOREIGN PATENT DOCUMENTS

JP        2019-087647  A      6/2019
JP        2019-106483  A      6/2019
(Continued)

OTHER PUBLICATIONS

Partial supplementary European search report dated Nov. 21, 2023 for corresponding European Application No. 21909946.2.
(Continued)

*Primary Examiner* — Peter M Albrecht

(57)       ABSTRACT

An insulated gate semiconductor device includes: a carrier transport layer of a first conductivity-type; an injection control region of a second conductivity-type; a carrier supply region of the first conductivity-type provided at an upper part of the injection control region; a base contact region of the second conductivity-type provided at an upper part of the injection control region; trenches penetrating the injection control region to reach the carrier transport layer; an insulated gate structure provided inside the respective trenches; an upper buried region of the second conductivity-type being in contact with a bottom surface of the injection control region; and a lower buried region of the second conductivity-type being in contact with a bottom surface of the upper buried region and a bottom surface of the respective trenches, wherein the lower buried region is separated from each other via the carrier transport layer between the trenches.

19 Claims, 40 Drawing Sheets

(56) References Cited

U.S. PATENT DOCUMENTS

| | | | |
|---|---|---|---|
| 10,403,749 B2 | 9/2019 | Kinoshita et al. | |
| 10,529,848 B2 | 1/2020 | Okumura | |
| 11,189,688 B2 | 11/2021 | De-Michielis et al. | |
| 11,205,719 B2 | 12/2021 | Miyashita | |
| 11,329,151 B2 | 5/2022 | Kinoshita et al. | |
| 2017/0141186 A1 | 5/2017 | Shiomi | |
| 2018/0197983 A1 | 7/2018 | Kinoshita et al. | |
| 2018/0204918 A1* | 7/2018 | Osuga | H10D 30/668 |
| 2019/0140091 A1 | 5/2019 | Kinoshita et al. | |
| 2019/0165166 A1 | 5/2019 | Kinoshita et al. | |
| 2019/0181261 A1 | 6/2019 | Okumura | |
| 2019/0371889 A1 | 12/2019 | Narita | |
| 2019/0371938 A1* | 12/2019 | Okumura | H10D 30/668 |
| 2020/0035791 A1 | 1/2020 | Oshima et al. | |
| 2020/0303540 A1 | 9/2020 | Miyashita | |
| 2021/0320170 A1 | 10/2021 | De-Michielis et al. | |

FOREIGN PATENT DOCUMENTS

| | | |
|---|---|---|
| JP | 6735950 B1 | 7/2020 |
| JP | 2020-155739 A | 9/2020 |
| WO | 2016/002766 A1 | 1/2016 |
| WO | 2017/064949 A1 | 4/2017 |
| WO | 2020/078626 A1 | 4/2020 |

OTHER PUBLICATIONS

Written Opinion of the International Searching Authority (Form PCT/ISA/237), dated Jan. 18, 2022 in International Application No. PCT/JP2021/039508 (4 pp.).

English Translation of International Search Report (Form PCT/ISA/210), dated Jan. 18, 2022 in International Application No. PCT/JP2021/039508 (2 pp.).

* cited by examiner

INSULATED GATE SEMICONDUCTOR DEVICE

CROSS-REFERENCE TO RELATED APPLICATION

This application is a Continuation of PCT Application No. PCT/JP2021/039508, filed on Oct. 26, 2021, and claims the priority of Japanese Patent Application No. 2020-215372, filed on Dec. 24, 2020, and Japanese Patent Application No. 2021-097196, filed on Jun. 10, 2021, the content of which are incorporated herein by reference.

TECHNICAL FIELD

The present invention relates to a trench-gate insulated gate semiconductor device.

BACKGROUND ART

Trench-gate MOSFETs are typically used for power semiconductor elements in order to reduce an ON resistance. Such a trench-gate MOSFET is influenced by a high electric field that tends to be applied to a gate insulating film provided at a bottom of a trench, leading the gate insulating film to be easily damaged.

To relax the intensity of the electric field at the bottom of the trench, a structure has been proposed in which a p-type buried region is provided at the bottom of the trench so as to be arranged in the middle between the trenches adjacent to each other (refer to WO 2017/064949 A1 and WO 2016/002766 A1).

SUMMARY OF THE INVENTION

Technical Problem

The respective configurations disclosed in WO 2017/064949 A1 and WO 2016/002766 A1, however, lead to a decrease in cell density to increase the ON resistance, since the p-type buried region is provided in the middle between the trenches adjacent to each other.

In view of the foregoing problems, the present invention provides a trench-gate insulated gate semiconductor device having a configuration capable of increasing a cell density while avoiding an increase in ON resistance.

Solution to Problem

An aspect of the present invention inheres in an insulated gate semiconductor device including: a carrier transport layer of a first conductivity-type; an injection control region of a second conductivity-type provided on a top surface of the carrier transport layer; a carrier supply region of the first conductivity-type selectively provided at an upper part of the injection control region; a base contact region of the second conductivity-type selectively provided at an upper part of the injection control region; trenches penetrating the injection control region to reach the carrier transport layer; an insulated gate structure provided inside the respective trenches; an upper buried region of the second conductivity-type provided inside the carrier transport layer to be in contact with a bottom surface of the injection control region; and a lower buried region of the second conductivity-type provided inside the carrier transport layer to be in contact with a bottom surface of the upper buried region and a bottom surface of the respective trenches, wherein the lower buried region is deposited at positions separated from each other via the carrier transport layer between the trenches adjacent to each other.

BRIEF DESCRIPTION OF THE DRAWINGS

FIG. 36 is a cross-sectional view in the horizontal direction as viewed from direction E-E' in FIG. 32 and FIG. 33;

FIG. 37 is a plan view that is an example illustrating a main part of an insulated gate semiconductor device according to a fifth embodiment;

DETAILED DESCRIPTION

Figure 1:
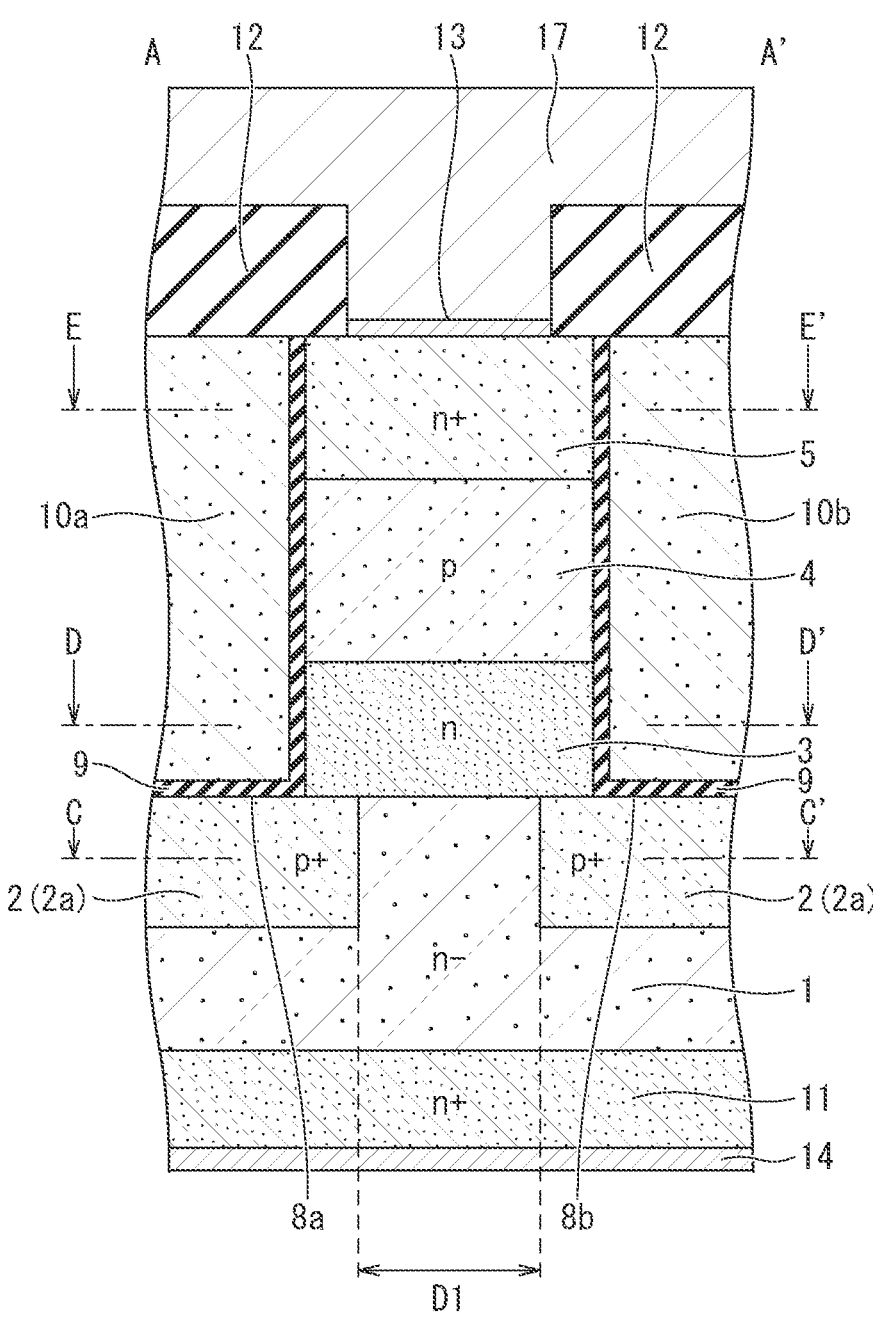
FIG. 1 is a cross-sectional view that is an example illustrating a main part of an insulated gate semiconductor device according to a first embodiment.

With reference to the Drawings, first to sixth embodiments of the present invention will be described below.

In the Drawings, the same or similar elements are indicated by the same or similar reference numerals. The Drawings are schematic, and it should be noted that the relationship between thickness and planer dimensions, the thickness proportion of each layer, and the like are different from real ones. Moreover, in some drawings, portions are illustrated with different dimensional relationships and proportions.

The first to sixth embodiments described below merely illustrate schematically devices and methods for specifying and giving shapes to the technical idea of the present invention, and the span of the technical idea is not limited to materials, shapes, structures, and relative positions of elements described herein.

In the Specification, a "carrier supply region" means a semiconductor region which supplies majority carriers as a main current. The carrier supply region is assigned to a semiconductor region which will be a source region in a MIS field-effect transistor (MISFET) or a MIS static induction transistor (MISSIT), an emitter region in an insulated-gate bipolar transistor (IGBT), and an anode region in a MIS controlled static induction thyristor (MIS controlled SI thyristor). A "carrier reception region" means a semiconductor region which receive the majority carriers as the main current. The carrier reception region is assigned to a semiconductor region which will be the drain region in the MISFET or the MISSIT, the collector region in the IGBT, and the cathode region in the MIS controlled SI thyristor. In a semiconductor device having a bipolar type operation such as the IGBT or the MIS controlled SI thyristor, carriers of a conductivity-type opposite to the majority carries are injected from the carrier reception region.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

Further, in the following description, there is exemplified a case where a first conductivity-type is an n-type and a second conductivity-type is a p-type. However, the relationship of the conductivity-types may be inverted to set the first conductivity-type to the p-type and the second conductivity-type to the n-type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration.

First Embodiment

<Structure of Insulated Gate Semiconductor Device>

Figure 2:
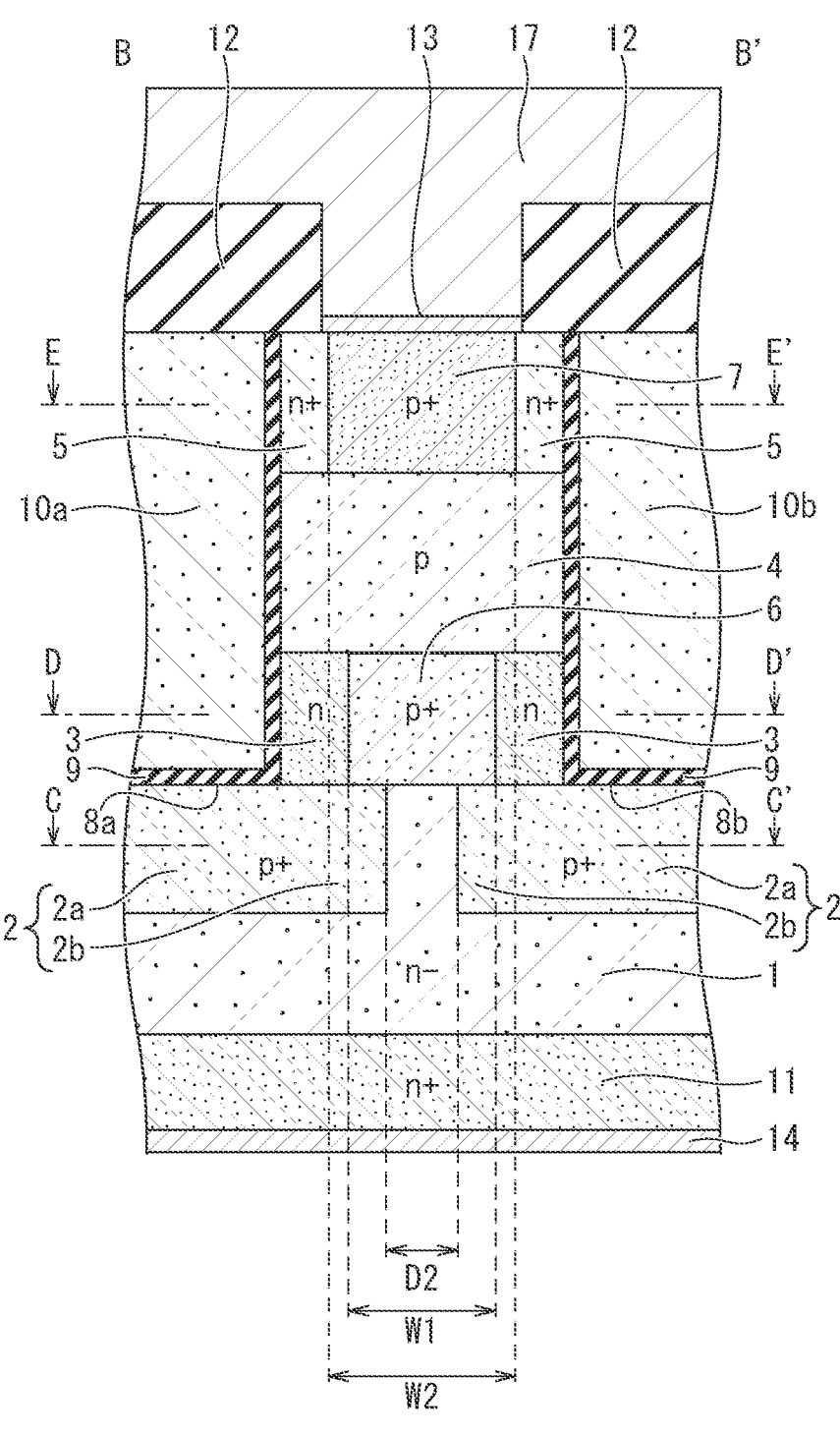
FIG. 2 is a cross-sectional view that is an example illustrating another main part of the insulated gate semiconductor device according to the first embodiment.
Figure 3:
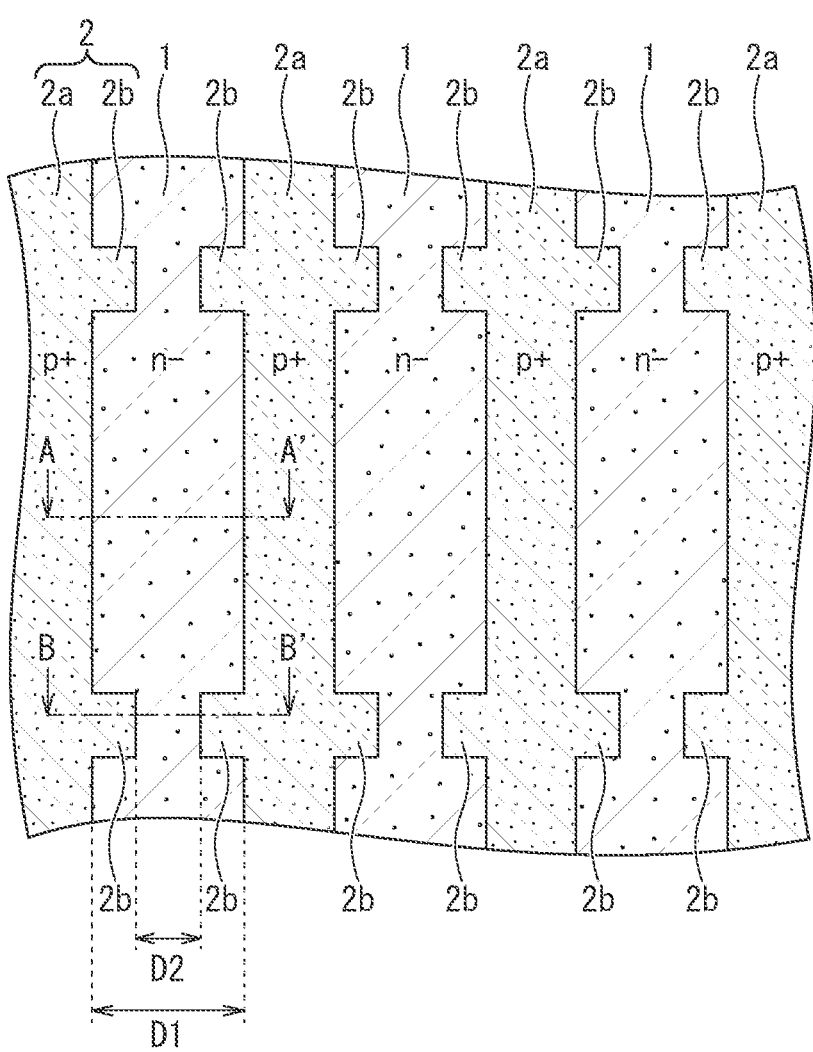
FIG. 3 is a cross-sectional view in the horizontal direction as viewed from direction C-C' in FIG. 1 and FIG. 2.
Figure 4:
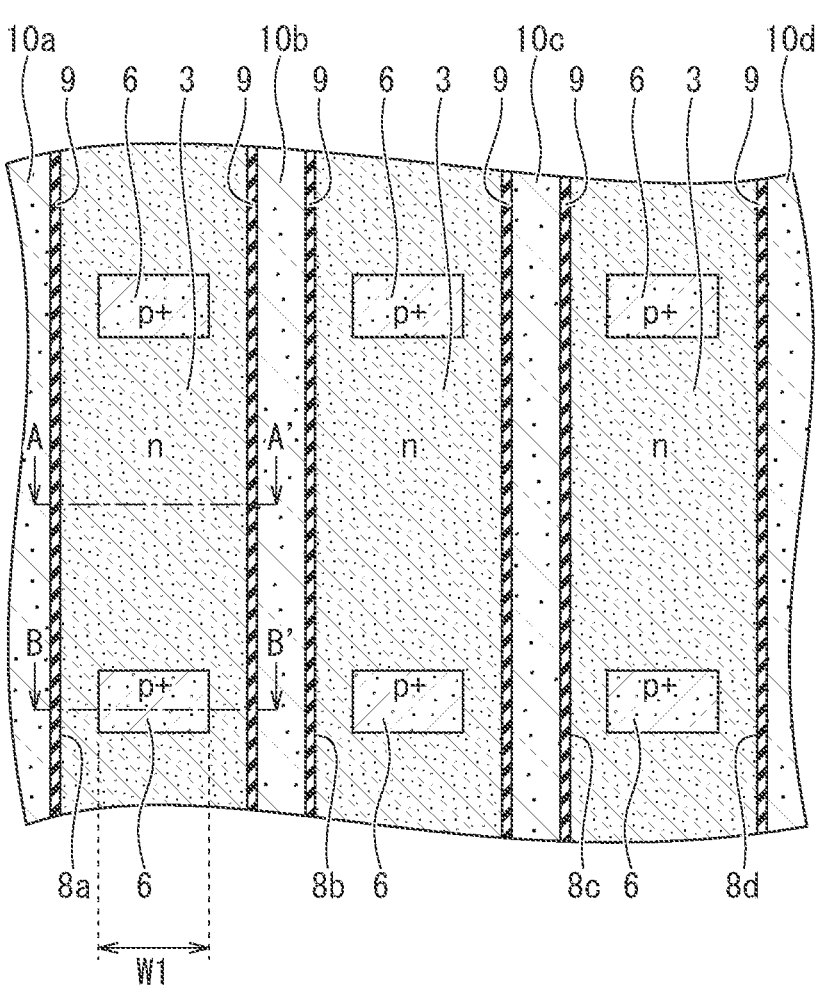
FIG. 4 is a cross-sectional view in the horizontal direction as viewed from direction D-D' in FIG. 1 and FIG. 2.
Figure 5:
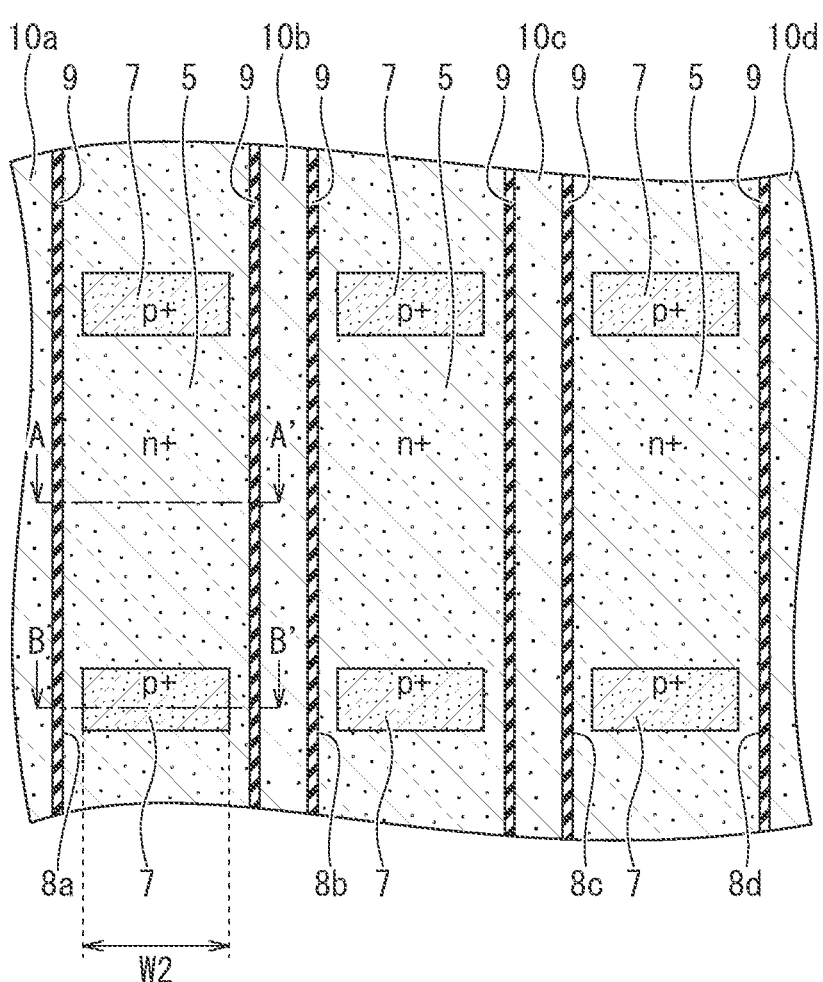
FIG. 5 is a cross-sectional view in the horizontal direction as viewed from direction E-E' in FIG. 1 and FIG. 2.

A structure of a MISFET that is an example of an insulated gate semiconductor device according to a first embodiment of the present invention is described below with reference to FIG. 1 to FIG. 5. FIG. 1 and FIG. 2 are each a cross-sectional view illustrating a main part of the insulated gate semiconductor device according to the first embodiment of the present invention. FIG. 3 corresponds to the cross-sectional view (the planar layout) in the horizontal direction as viewed from direction C-C' in FIG. 1 and FIG. 2. FIG. 4 corresponds to the cross-sectional view (the planar layout) in the horizontal direction as viewed from direction D-D' in FIG. 1 and FIG. 2. FIG. 5 corresponds to the cross-sectional view (the planar layout) in the horizontal direction as viewed from direction E-E' in FIG. 1 and FIG. 2. FIG. 1 corresponds to the cross-sectional view in the vertical direction as viewed from direction A-A' in FIG. 3 to FIG. 5, and FIG. 2 corresponds to the cross-sectional view in the vertical direction as viewed from direction B-B' in FIG. 3 to FIG. 5.

As illustrated in FIG. 1 and FIG. 2, the insulated gate semiconductor device according to the first embodiment of the present invention includes a carrier transport layer (1, 3) of a first conductivity-type (n-type), and an injection control region (a base region) 4 of a second conductivity-type (p-type) deposited on the carrier transport layer (1, 3). The carrier transport layer (1, 3) is made from a semiconductor (wide band-gap semiconductor) material having a wider band gap than silicon such as silicon carbide (SiC). The carrier transport layer (1, 3) includes a drift layer 1 of $n^-$-type, and a current spreading layer (CSL) 3 of n-type deposited on the top surface of the drift layer 1.

The drift layer 1 is a region in which majority carriers of main current flow in a drift electric field. The drift layer 1 is an epitaxially-grown layer of SiC, for example. An impurity concentration of the drift layer 1 is set to about $1 \times 10^{14}$ cm$^{-3}$ or greater and $1 \times 10^{16}$ cm$^{-3}$ or smaller, for example.

The current spreading layer 3 is a region in which majority carriers injected from the base region 4 spread out to move through. The current spreading layer 3 is an epitaxially-grown layer of SiC, for example. The current spreading layer 3 has a higher impurity concentration than the drift layer 1, which is set to about $1 \times 10^{16}$ cm$^{-3}$ or greater and $1 \times 10^{18}$ cm$^{-3}$ or smaller, for example.

The base region 4 is deposited on the top surface of the current spreading layer 3. The base region 4 regulates the amount of the majority carriers as a main current injected to the current spreading layer 3. The base region 4 is an epitaxially-grown layer of SiC, for example. An impurity concentration of the base region 4 is set to about $1 \times 10^{16}$ cm$^{-3}$ or greater and $1 \times 10^{18}$ cm$^{-3}$ or smaller, for example.

As illustrated in FIG. 1 and FIG. 2, a carrier supply region (a source region) 5 of $n^+$-type is selectively deposited at an upper part of the base region 4. The source region 5 has a higher impurity concentration than the drift layer 1, which is set to about $1 \times 10^{18}$ cm$^{-3}$ or greater and $1 \times 10^{21}$ cm$^{-3}$ or smaller, for example.

As illustrated in FIG. 2, a base contact region 7 of $p^+$-type is selectively deposited at an upper part of the base region 4. The respective side surfaces on both sides of the base contact region 7 are in contact with the source region 5. The base contact region 7 has a higher impurity concentration than the base region 4, which is set to about $1 \times 10^{20}$ cm$^{-3}$ or greater and $5 \times 10^{20}$ cm$^{-3}$ or smaller, for example.

As illustrated in FIG. 1 and FIG. 2, trenches 8a and 8b are provided to penetrate the source region 5, the base region 4, and the current spreading layer 3 so as to reach the top surface of the drift layer 1. The respective side surfaces of the trenches 8a and 8b are in contact with the source region 5, the base region 4, and the current spreading layer 3. The respective bottoms of the trenches 8a and 8b are in contact with the top surface of a lower buried region 2 of $p^+$-type deposited at an upper part of the drift layer 1. The trenches 8a and 8b may be provided to have a greater depth so that the respective bottoms of the trenches 8a and 8b are located inside the lower buried region 2. For example, the trenches 8a and 8b each have a depth of about 1 micrometer or greater and 2 micrometers or less, a width of about 0.3 micrometers or greater and 1 micrometer or less, and a gap of about 1 micrometer or greater and 5 micrometers or less.

The insulated gate semiconductor device according to the first embodiment of the present invention includes an insulated gate structure (9, 10a), (9, 10b) provided inside the respective trenches 8a and 8b. The insulated gate structure (9, 10a), (9, 10b) controls a surface potential of the base region 4 located on the side walls of the trenches 8a and 8b. The insulated gate structure (9, 10a), (9, 10b) includes a gate insulating film 9 deposited on the bottom surfaces and the side surfaces of the trenches 8a and 8b, and gate electrodes 10a and 10b deposited inside the trenches 8a and 8b with the gate insulating film 9 interposed.

The gate insulating film 9 as used herein can be a silicon oxide film (a SiO$_2$ film), for example, and other examples include a silicon oxynitride (SiON) film, a strontium oxide (SrO) film, a silicon nitride (Si$_3$N$_4$) film, an aluminum oxide (Al$_2$O$_3$) film, a magnesium oxide (MgO) film, an yttrium oxide (Y$_2$O$_3$) film, a hafnium oxide (HfO$_2$) film, a zirconium oxide (ZrO$_2$) film, a tantalum oxide (Ta$_2$O$_5$) film, and a bismuth oxide (Bi$_2$O$_3$) film. Further, two or more of these films listed above may be stacked on one another so as to be used as a composite film.

A material used for the gate electrodes 10a and 10b may be a polysilicon layer (a doped polysilicon layer) with which p-type impurity ions such as boron (B) or n-type impurity ions such as phosphorus (P) are heavily doped, or refractory metal, for example. While FIG. 1 and FIG. 2 illustrate the case in which the top surfaces of the gate electrodes 10a and 10b are located at the same level as the top surface of the source region 5, the present embodiment is not limited to this case. For example, the upper part of the respective gate electrodes 10a and 10b may extend over the top surface of the source region 5 with the gate insulating film 9 interposed.

An interlayer insulating film 12 is deposited on the gate electrodes 10a and 10b. The interlayer insulating film 12 to be used may be a silicon oxide film (a SiO$_2$ film) without containing phosphorus (P) or boron (B) which is referred to as a non-doped silicate glass (NSG) film. The interlayer insulating film 12 may also be a phosphosilicate glass film (a PSG film), a borosilicate glass film (a BSG film), a borophosphosilicate glass film (a BPSG film), a silicon nitride (Si$_3$N$_4$) film, or a stacked layer of these films listed above.

As illustrated in FIG. 1 and FIG. 2, the insulated gate semiconductor device according to the first embodiment of the present invention includes the $p^+$-type lower buried region 2 selectively deposited at the upper part of the drift layer 1, and an upper buried region 6 of $p^+$-type selectively deposited inside the current spreading layer 3 so as to be in contact with the top surface of the lower buried region 2.

The top surface of the lower buried region 2 is located to be in contact with the bottom surfaces of the trenches 8a and 8b. The lower buried region 2 has a function of relaxing an electric field applied to the gate insulating film 9 located at the bottom surfaces of the trenches 8a and 8b so as to protect the gate insulating film 9. An impurity concentration of the lower buried region 2 is higher than that of the base region 4, and is set to about $5 \times 10^{17}$ cm$^{-3}$ or greater and $2 \times 10^{19}$ cm$^{-3}$ or less, for example.

FIG. 1 is the cross-sectional view illustrating the lower buried region 2 deposited at the positions separated from each other with a gap D1 while the upper part of the drift layer 1 is interposed in the middle of the trenches 8a and 8b adjacent to each other. FIG. 2 is the cross-sectional view illustrating the lower buried region 2 deposited at the positions separated from each other with a gap D2 narrower than the gap D1 illustrated in FIG. 1 while the upper part of the drift layer 1 is interposed in the middle of the trenches 8a and 8b adjacent to each other. The gap D1 illustrated in FIG. 1 may be either the same as or narrower than the gap D2 illustrated in FIG. 2. As illustrated in FIG. 1 and FIG. 2, the respective side surfaces and the bottom surface of the lower buried region 2 define the corner parts at the respective edges separated to be opposed to each other.

As illustrated in FIG. 2, the respective side surfaces on both sides of the upper buried region 6 are separated from the trenches 8a and 8b and are in contact with the current spreading layer 3. The bottom surface of the upper buried region 6 is in contact with the top surfaces of the respective edges of the lower buried region 2 separated to be opposed to each other. The impurity concentration of the upper buried region 6 may be either equal to or different from the impurity concentration of the lower buried region 2. The impurity concentration of the upper buried region 6 is set to about $1\times10^{18}$ cm$^{-3}$ or greater and $1\times10^{19}$ cm$^{-3}$ or less, for example.

As illustrated in FIG. 2, the width W1 of the upper buried region 6 is greater than the gap D2 of the lower buried region 2. The width W1 of the upper buried region 6 is narrower than the width W2 of the base contact region 7. The width W1 of the upper buried region 6 may be either the same as or greater than the width W2 of the base contact region 7. FIG. 2 is the cross-sectional view illustrating the base contact region 7, the base region 4, the upper buried region 6, and the lower buried region 2 that straightly overlap with each other in the depth direction of the trenches (in the vertical direction in FIG. 2).

As illustrated in FIG. 3, the lower buried region 2 includes a plurality of stripe parts 2a extending parallel to each other in the vertical direction in FIG. 3 in the planar pattern, and projecting parts 2b projecting on the right and left sides of the stripe parts 2a in the direction perpendicular to the direction in which the respective stripe parts 2a extend (in the horizontal direction in FIG. 4). The drift layer 1 is provided to surround the circumference of the lower buried region 2.

As illustrated in FIG. 4, the respective trenches 8a to 8d are arranged to include a stripe part extending parallel to each other in the planar pattern in the vertical direction in FIG. 4. The gate electrodes 10a to 10d are deposited inside the trenches 8a and 8b with the gate insulating film 9 interposed. The trenches 8a to 8d are located at the positions overlapping with the stripe parts 2a of the lower buried region 2 illustrated in FIG. 3.

As illustrated in FIG. 4, the current spreading layer 3 is provided between the respective trenches 8a to 8d. The upper buried region 6 is provided inside the current spreading layer 3. The upper buried region 6 has a rectangular planar pattern to be arranged into several positions at intervals in the extending direction of the trenches 8a to 8d (in the vertical direction in FIG. 4). The respective positions of the upper buried region 6 overlap with the projecting parts 2b of the lower buried region 2 illustrated in FIG. 3. The upper buried region 6 is also arranged to be surrounded by the current spreading layer 3.

As illustrated in FIG. 5, the source region 5 is provided between the respective trenches 8a to 8d. The base contact region 7 is provided inside the source region 5. The base contact region 7 has a rectangular planar pattern to be arranged into several positions at intervals in the extending direction of the trenches 8a to 8d (in the vertical direction in FIG. 5). The respective positions of the base contact region 7 overlap with the projecting parts 2b of the lower buried region 2 illustrated in FIG. 3 and the upper buried region 6 illustrated in FIG. 4. The base contact region 7 is arranged to be surrounded by the source region 5.

As illustrated in FIG. 1 and FIG. 2, a first main electrode (13, 17) is deposited on the source region 5 and the base contact region 7 so as to be in contact with the source region 5 and the base contact region 7. The first main electrode (13, 17) includes a source contact layer 13 provided in contact with the top surface of the base contact region 7, and a source electrode 17 provided in contact with the top surface of the source contact layer 13. FIG. 1 and FIG. 2 illustrate the source electrode 17 arranged to cover the interlayer insulating film 12. A material used for the source electrode 17 can be aluminum (Al) or an Al—Si alloy, for example. The source contact layer 13 made from nickel silicide (Ni Six), for example, is provided between the source electrode 17 and both of the source region 5 and the base contact region 7. A barrier metal layer made from titanium nitride (TiN), for example, may be provided between the source contact layer 13 and the source electrode 17.

A carrier reception region (a drain region) 11 of n$^+$-type is deposited on the bottom surface of the drift layer 1. The drain region 11 is a SiC substrate, for example. An impurity concentration of the drain region 11 is higher than that of the drift layer 1, and is set to about $1\times10^{17}$ cm$^{-3}$ or greater and $1\times10^{20}$ cm$^{-3}$ or less, for example.

A second main electrode (a drain electrode) 14 is deposited on the bottom surface of the drain region 11. The drain electrode 14 can be a single film made from gold (Au), or can be a metallic film including Al, nickel (Ni), and Au stacked in this order. A metallic film such as molybdenum (Mo) or tungsten (W) or an alloy layer in which nickel (Ni) and the titanium (Ti) are stacked so as to be led to react with SiC may be provided between the drain region 11 and the drain electrode 14.

The insulated gate semiconductor device according to the first embodiment has a configuration in which the structure illustrated in FIG. 1 and FIG. 2 is periodically arranged to have a multi-channel structure, as illustrated in FIG. 3 to FIG. 5, so as to implement a power semiconductor device (a power device) through which a large amount of current flows.

Figure 6:
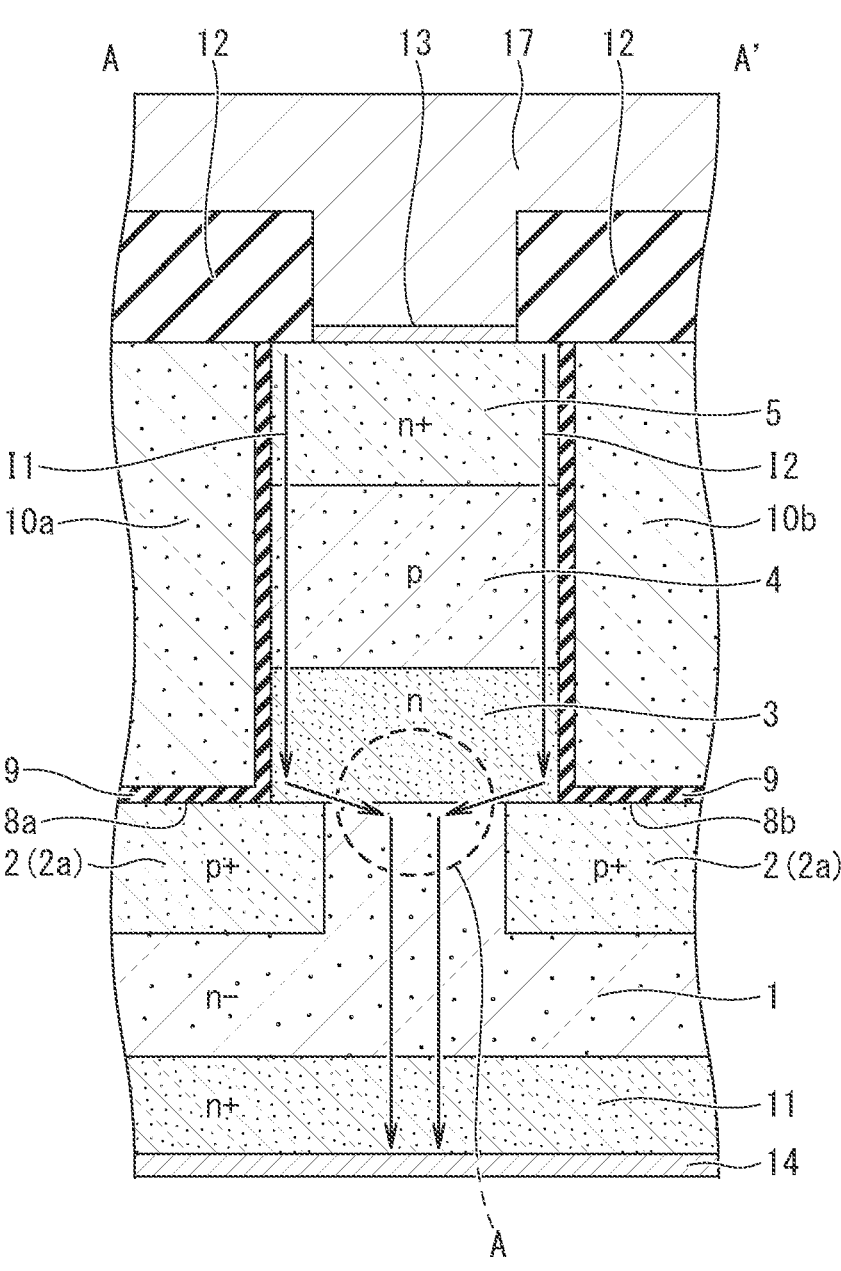
FIG. 6 is a cross-sectional view illustrating the main part for explaining the operation of the insulated gate semiconductor device according to the first embodiment.

Upon the operation of the insulated gate semiconductor device according to the first embodiment, a positive voltage is applied to the drain electrode 14, and a positive voltage of a threshold or greater is applied to the gate electrodes 10a and 10b, as illustrated in FIG. 6, so as to form an inversion channel at a part of the base region 4 in contact with the trenches 8a and 8b to be led to the ON-state. In the ON-state, main currents I1 and I2 of majority carriers (electrons) can be led to flow through the region adjacent to the respective side surfaces of the trenches 8a and 8b next to each other, as schematically indicated by the arrows in FIG. 6. When a large amount of current flows, a resistance is increased in region A surrounded by the broken line in FIG. 6 due to the increase in current density, so as to increase the tolerance to short-circuit fault. When the voltage applied to the gate electrodes 10a and 10b is less than the threshold, no inversion channel is formed in the base region 4 so as to be led to the OFF-state. This does not cause the main current to flow through.

Figure 7:
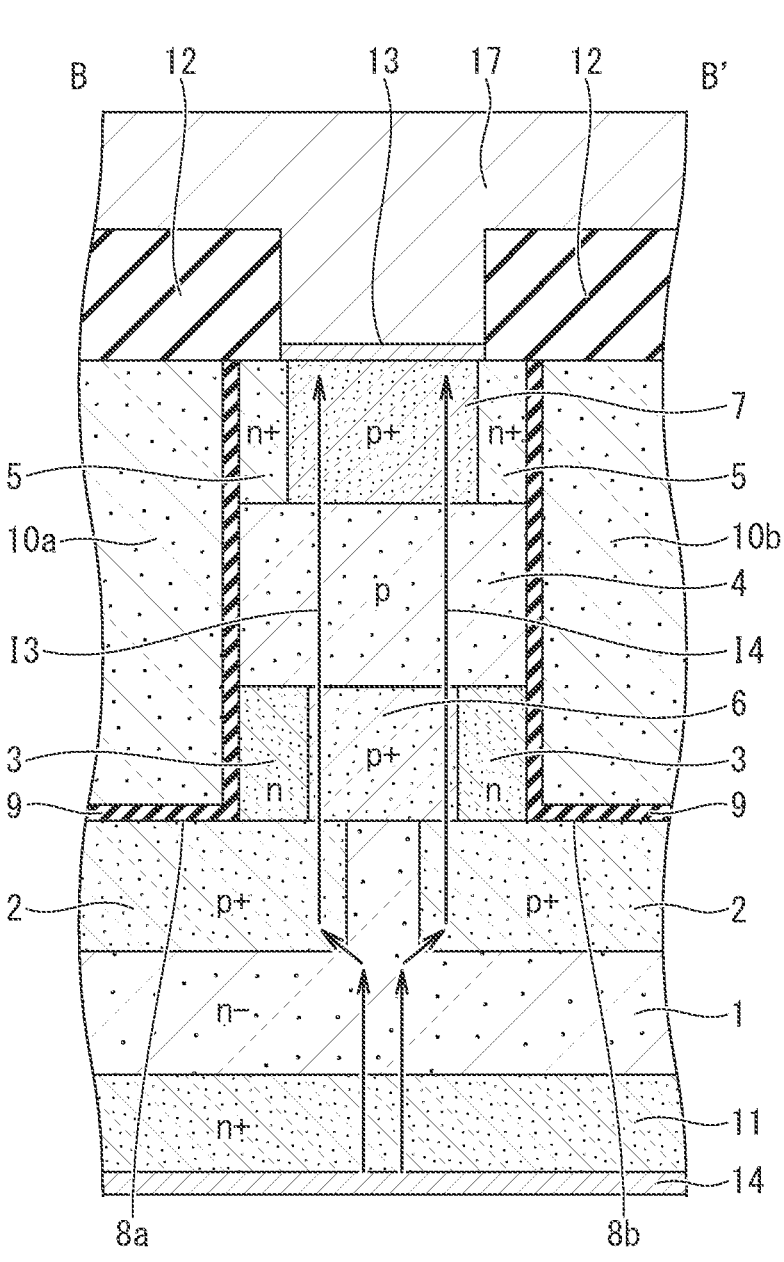
FIG. 7 is a cross-sectional view illustrating the other main part for explaining the operation of the insulated gate semiconductor device according to the first embodiment.

Further, the insulated gate semiconductor device according to the first embodiment tends to lead the electric field to be concentrated at the corner parts at the respective edges of the lower buried region 2 opposed to each other, as illustrated in FIG. 7, to cause an avalanche breakdown when a reverse bias is applied to exceed a breakdown field, and lead avalanche currents I3 and I4 to flow through, as schematically indicated by the arrows in FIG. 7. The avalanche currents I3 and I4 straightly flow from the respective corners of the lower buried region 2 toward the upper buried region 6, the base region 4, and the base contact region 7 in the depth direction of the trenches (in the vertical direction in FIG. 7).

Comparative Example

Figure 8:
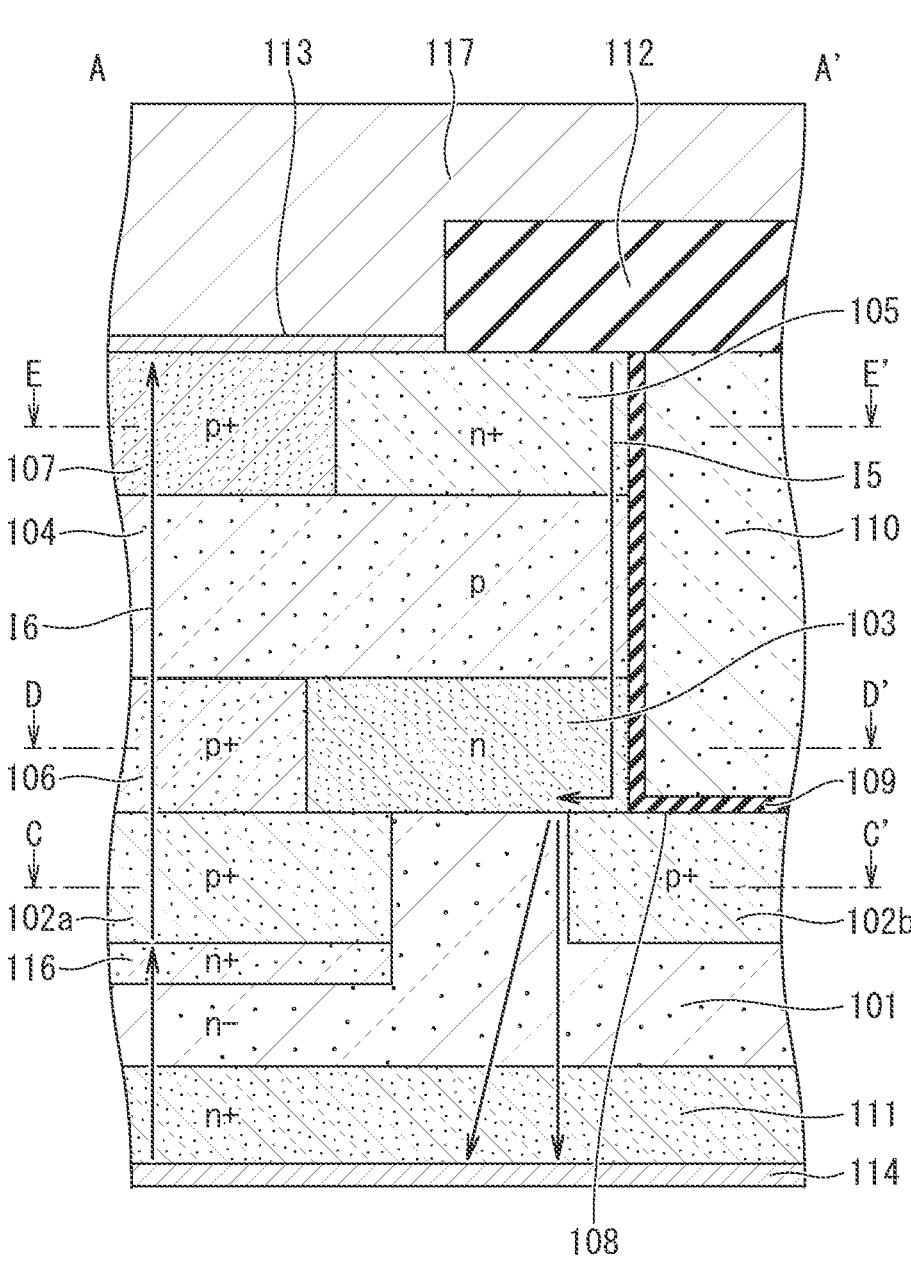
FIG. 8 is a cross-sectional view illustrating a main part of an insulated gate semiconductor device of a comparative example.
Figure 9:
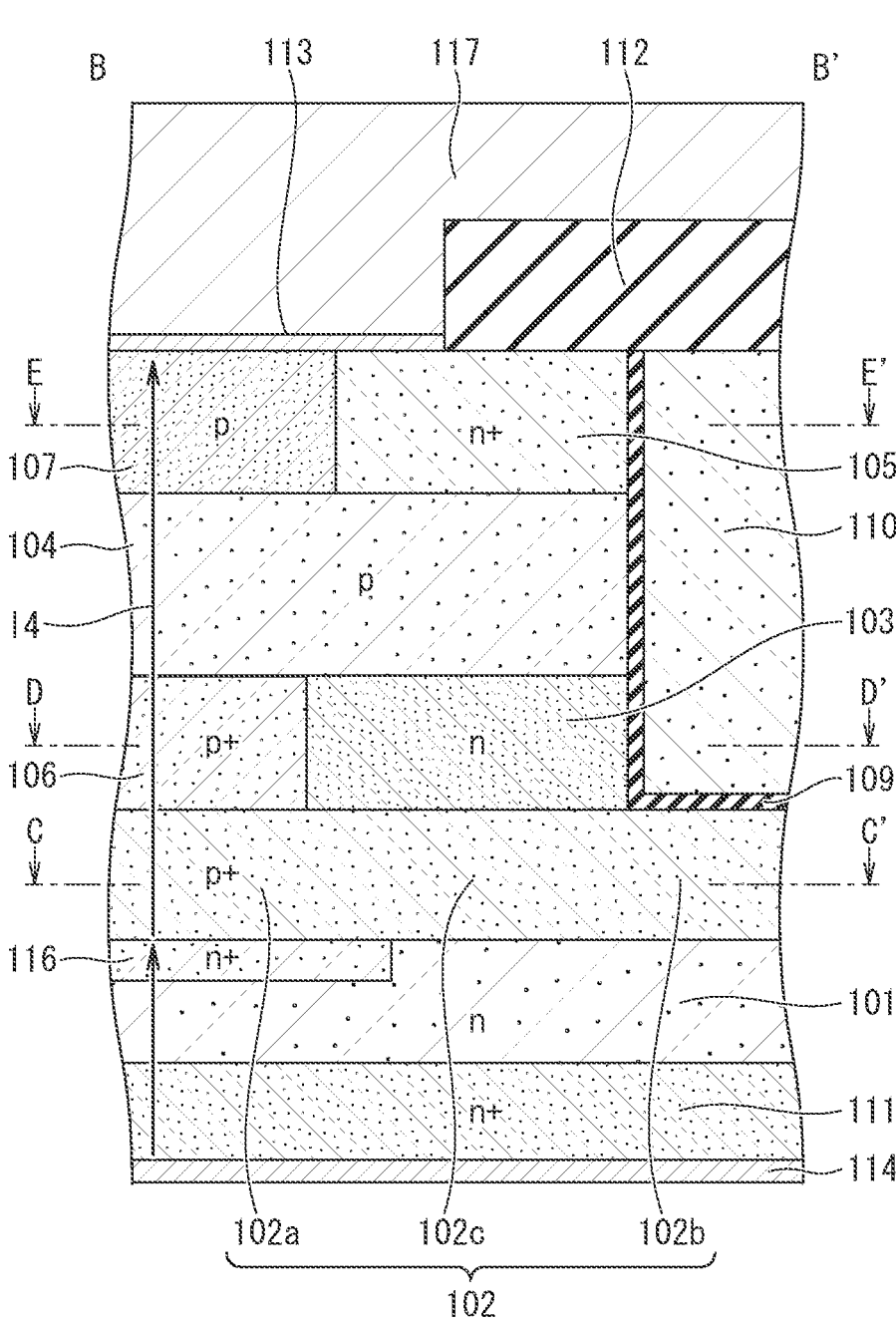
FIG. 9 is a cross-sectional view illustrating another main part of the insulated gate semiconductor device of a comparative example.
Figure 10:
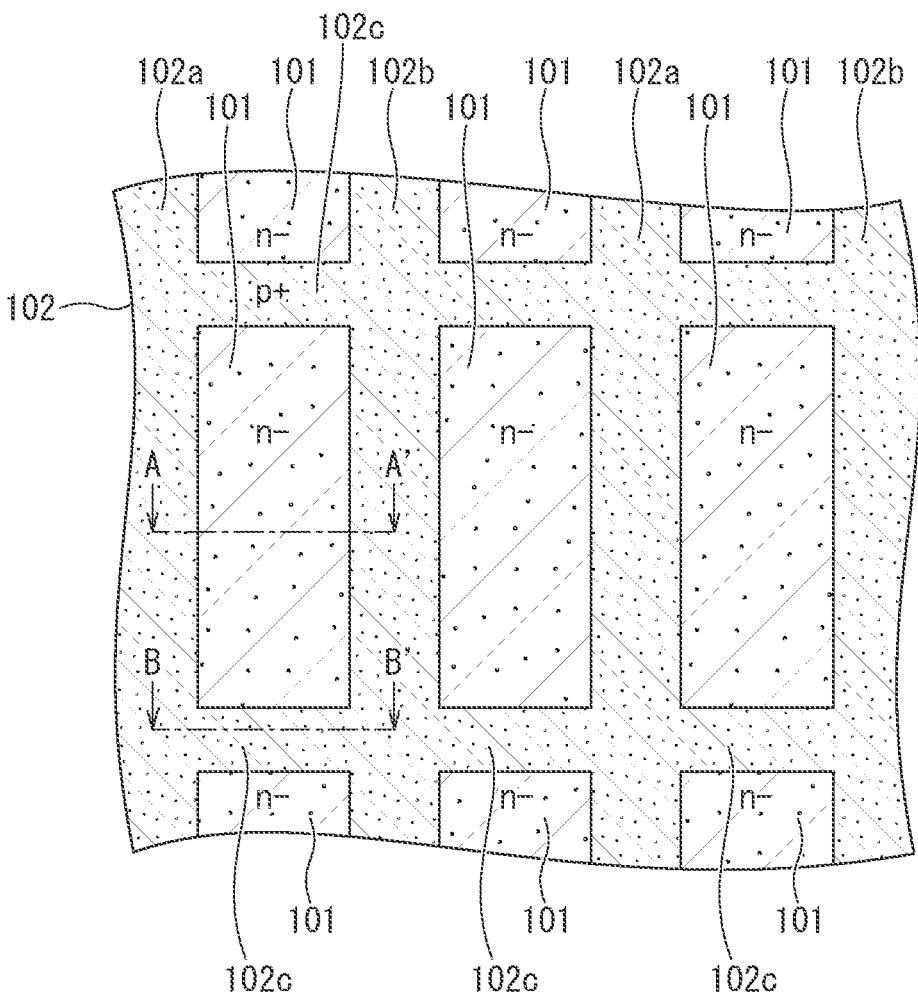
FIG. 10 is a cross-sectional view in the horizontal direction as viewed from direction C-C' in FIG. 8 and FIG. 9.
Figure 11:
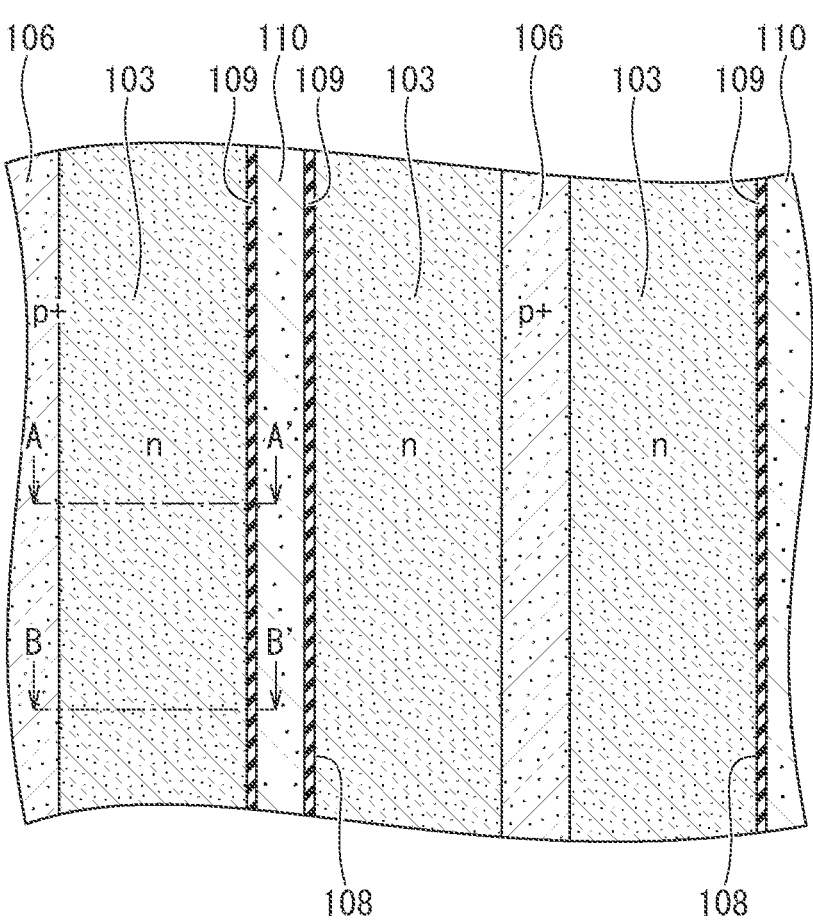
FIG. 11 is a cross-sectional view in the horizontal direction as viewed from direction D-D' in FIG. 8 and FIG. 9.
Figure 12:
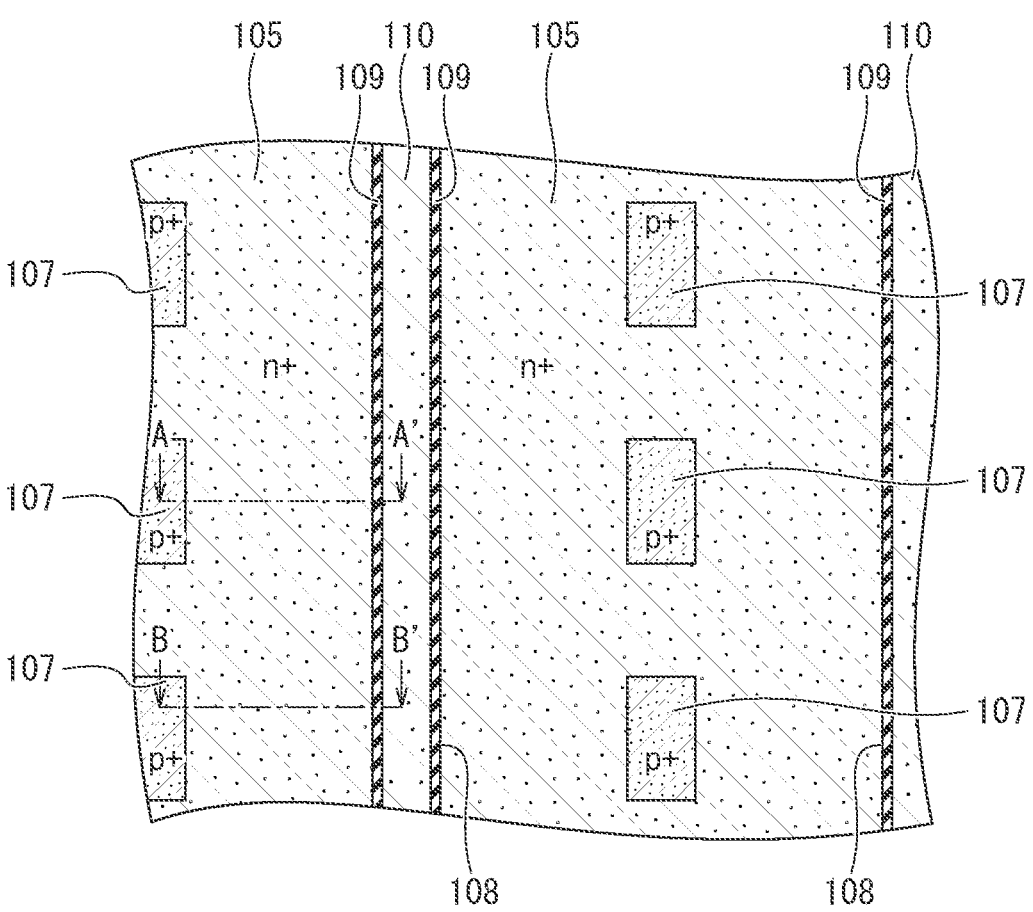
FIG. 12 is a cross-sectional view in the horizontal direction as viewed from direction E-E' in FIG. 8 and FIG. 9.

An insulated gate semiconductor device of a comparative example is described below with reference to FIG. 8 to FIG. 12. FIG. 8 and FIG. 9 are each a cross-sectional view illustrating a main part of the insulated gate semiconductor device of the comparative example. FIG. 10 corresponds to the cross-sectional view (the planar layout) in the horizontal direction as viewed from direction C-C' in FIG. 8 and FIG. 9. FIG. 11 corresponds to the cross-sectional view (the planar layout) in the horizontal direction as viewed from direction D-D' in FIG. 8 and FIG. 9. FIG. 12 corresponds to the cross-sectional view (the planar layout) in the horizontal direction as viewed from direction E-E' in FIG. 8 and FIG. 9. FIG. 8 corresponds to the cross-sectional view in the vertical direction as viewed from direction A-A' in FIG. 10 to FIG. 12, and FIG. 9 corresponds to the cross-sectional view in the vertical direction as viewed from direction B-B' in FIG. 10 to FIG. 12.

As illustrated in FIG. 8 and FIG. 9, the insulated gate semiconductor device of the comparative example includes a drift layer 101 of $n^-$-type, and a current spreading layer 103 of n-type deposited on the top surface of the drift layer 101. A base region 104 of p-type is further deposited on the top surface of the current spreading layer 103. A source region 105 of $n^+$-type and a base contact region 107 of $p^+$-type are provided at the upper parts of the base region 104. A first main electrode (113, 117) is provided on the respective top surfaces of the source region 105 and the base contact region 107. The first main electrode (113, 117) includes a source contact layer 113 and a source electrode 117.

As illustrated in FIG. 8 and FIG. 9, trenches 108 are provided to penetrate the source region 105, the base region 104, and the current spreading layer 103. A gate electrode 110 is provided inside the trenches 108 with the gate insulating film 109 interposed. An interlayer insulating film 112 is deposited on the top surface of the gate electrode 110. A drain region 111 of $n^+$-type is deposited on the bottom surface of the drift layer 101. A drain electrode 114 is further deposited on the bottom surface of the drain region 111.

As illustrated in FIG. 8 and FIG. 9, the insulated gate semiconductor device of the comparative example includes a lower buried region 102 of $p^+$-type provided at the upper part of the drift layer 101, and an upper buried region 106 of $p^+$-type provided inside the current spreading layer 103 so as to be in contact with the top surface of the lower buried region 102. The lower buried region 102 includes a contact bottom region 102a located below the base contact region 107 in the middle of the trenches 108 adjacent to each other, a trench bottom region 102b with the top surface in contact with the bottom surface of the respective trenches 108, and a connecting region 102c connecting the contact bottom region 102a and the trench bottom region 102b to each other. A high-concentration region 116 of $n^+$-type is deposited on the bottom surface of the contact bottom region 102a.

As illustrated in FIG. 10, the lower buried region 102 is arranged into a lattice-like shape in the planar pattern. The contact bottom region 102a of the lower buried region 102 is provided to include a plurality of stripe parts extending parallel to each other. The trench bottom region 102b of the lower buried region 102 is provided to include a plurality of stripe parts extending parallel to the stripe parts of the contact bottom region 102a. The respective stripe parts of the contact bottom region 102a and the trench bottom region 102b are arranged alternately and repeatedly in the direction perpendicular to the extending direction. The connecting region 102c of the lower buried region 102 is provided to include a plurality of stripe parts extending in the direction perpendicular to the extending direction of the contact bottom region 102a and the trench bottom region 102b. The stripe parts of the connecting region 102c are located at intervals in the extending direction of the contact bottom region 102a and the trench bottom region 102b.

As illustrated in FIG. 11, the trenches 108 are arranged to include stripe parts extending parallel to each other. The upper buried region 106 is provided to include stripe parts extending parallel to the trenches 108. The trenches 108 and the stripe parts of the upper buried region 106 are arranged alternately and repeatedly in the direction perpendicular to the extending direction. The trenches 108 are located at the positions overlapping with the stripe parts of the trench bottom region 102b illustrated in FIG. 10. The upper buried region 106 is located at the position overlapping with the contact bottom region 102a illustrated in FIG. 10.

As illustrated in FIG. 12, the source region 105 is provided between the trenches 108. The base contact region 107 is provided inside the source region 105. The base contact region 107 is provided at several positions at intervals in the extending direction of the trenches 108. The positions of the base contact region 107 overlap with the respective positions of the contact bottom region 102a illustrated in FIG. 10 and the upper buried region 106 illustrated in FIG. 11.

The configuration of the insulated gate semiconductor device of the comparative example as illustrated in FIG. 8 to FIG. 12, in which the contact bottom region 102a of the lower buried region 102 is provided in the middle between the trenches 108 adjacent to each other, tends to decrease the cell density to lead to an increase in the ON resistance. In contrast, the insulated gate semiconductor device according to the first embodiment has the configuration without the region corresponding to the contact bottom region 102a of the insulated gate semiconductor device of the comparative example, as illustrated in FIG. 1 to FIG. 5, so as to reduce the gap between the respective trenches 8a to 8d. This configuration can increase the cell density to reduce the ON resistance. The insulated gate semiconductor device according to the first embodiment also has the configuration in which the both side surfaces of the upper buried region 6 and the both side surfaces of the base contact region 7 are separated from the respective trenches 8a and 8b, so as to further reduce the ON resistance.

The configuration of the insulated gate semiconductor device of the comparative example as illustrated in FIG. 8 and FIG. 9 cannot increase the current density, which lead to an increase in the resistance accordingly, since the main current I5 does not flow toward the contact bottom region 102a upon the ON state. In contrast, the configuration of the insulated gate semiconductor device according to the first embodiment as illustrated in FIG. 6 can allow the main currents I1 and I2 to flow through the regions close to the respective side surfaces of the trenches 8a and 8b adjacent to each other, so as to increase the current density to reduce the resistance.

In addition, the configuration of the insulated gate semiconductor device of the comparative example needs to cause an avalanche breakdown not in the trench bottom region 102b but in the contact bottom region 102a to lead an avalanche current I6 to flow through in order to protect the gate insulating film 109, as illustrated in FIG. 8 and FIG. 9. This further needs to form the n$^+$-type high-concentration region 116 under the contact bottom region 102a by the implantation of n-type impurity ions such as nitrogen (N), which inevitably increases the cost required during the process. In contrast, the configuration of the insulated gate semiconductor device according to the first embodiment leads the electric field to be concentrated at the corner parts of the lower buried region 2, as illustrated in FIG. 7, so as to cause the avalanche breakdown at the corner parts of the lower buried region 2. This leads the avalanche currents I3 and I4 to flow through straightly without flowing through the regions close to the trenches 8a and 8b, so as to prevent damage to the gate insulating film 9. Since the present embodiment does not need to form the region such as the n$^+$-type high-concentration region 116 as illustrated in the insulated gate semiconductor device of the comparative example, the increase in the cost required during the process can be avoided.

<Method of Manufacturing Insulated Gate Semiconductor Device>

A method of manufacturing the insulated gate semiconductor device according to the first embodiment of the present invention is described below with reference to FIG. 13 to FIG. 17. The illustration of the manufacturing method is made below while focusing on the cross section of the insulated gate semiconductor device illustrated in FIG. 2. It should be understood that the method of manufacturing the gate insulated semiconductor device described below is an example, and the insulated gate semiconductor device can be manufactured by other methods not described herein including modified examples of the present embodiment within the scope of the appended claims.

Figure 13:
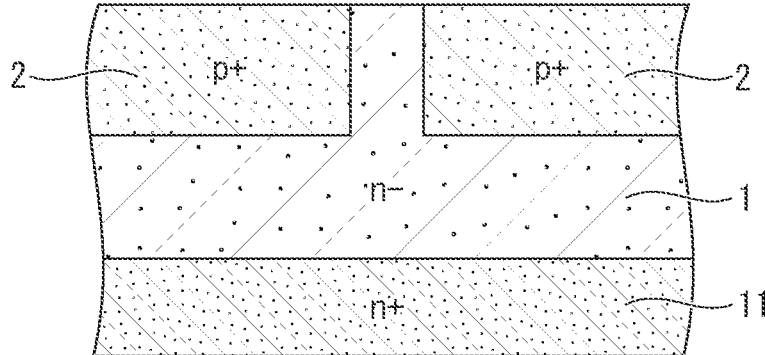
FIG. 13 is a cross-sectional process view for explaining an example of a method of manufacturing the insulated gate semiconductor device according to the first embodiment.

First, a SiC substrate of n$^+$-type with which n-type impurity ions such as nitrogen (N) are heavily doped is prepared so as to be used as the drain region 11. Next, the drift layer 1 made from SiC of n$^-$-type is epitaxially grown on the SiC substrate. A photoresist film is applied on the top surface of the drift layer 1, and is then delineated by photolithography. Using the delineated photoresist film as a mask, p-type impurity ions such as aluminum (Al) are implanted. The execution of subsequent annealing after the removal of the photoresist film activates the p-type impurity ions. The p$^+$-type lower buried region 2 is thus selectively formed at the upper part of the drift layer 1, as illustrated in FIG. 13.

Figure 14:
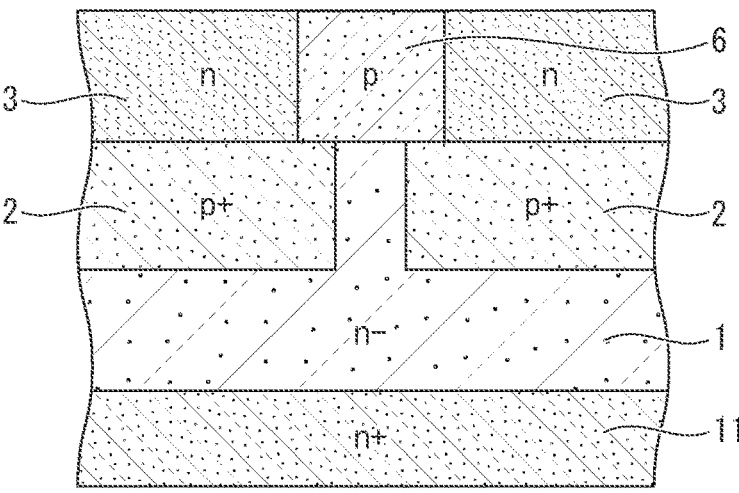
FIG. 14 is a cross-sectional process view continued from FIG. 13 for explaining the example of the method of manufacturing the insulated gate semiconductor device according to the first embodiment.

Next, the current spreading layer 3 made from SiC of n-type is epitaxially grown on the respective top surfaces of the drift layer 1 and the lower buried region 2. A photoresist film is applied on the top surface of the current spreading layer 3, and is then delineated by photolithography. Using the delineated photoresist film as a mask, p-type impurity ions such as Al are implanted. The execution of the subsequent annealing after the removal of the photoresist film activates the p-type impurity ions. The p$^+$-type upper buried region 6 is thus selectively formed inside the current spreading layer 3, as illustrated in FIG. 14.

Figure 15:
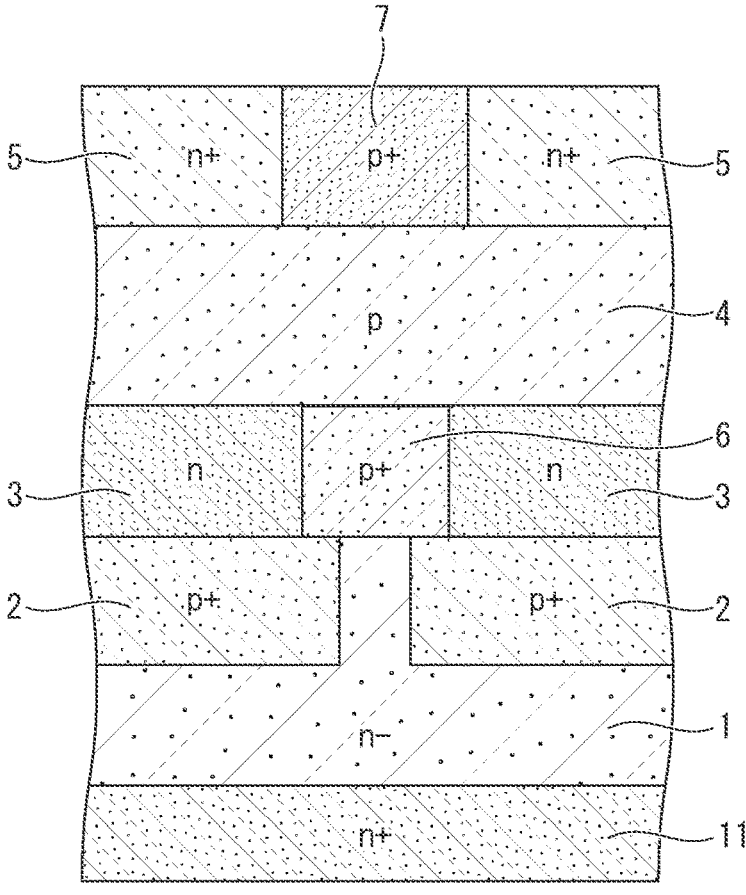
FIG. 15 is a cross-sectional process view continued from FIG. 14 for explaining the example of the method of manufacturing the insulated gate semiconductor device according to the first embodiment.

Next, the base region 4 made from SiC of p-type is epitaxially grown on the top surface of the current spreading layer 3. A photoresist film is then applied on the top surface of the base region 4, and is delineated by photolithography. Using the delineated photoresist film as a mask, n-type impurity ions such as nitrogen (N) are implanted. Another photoresist film is further applied on the top surface of the base region 4 after the removal of the photoresist film, and is then delineated by photolithography. Using the delineated photoresist film as a mask, p-type impurity ions such as Al are implanted. The execution of the subsequent annealing after the removal of the photoresist film activates the n-type impurity ions and the p-type impurity ions. The n$^+$-type source region 5 and the p$^+$-type base contact region 7 are thus selectively formed at the upper parts of the base region 4, as illustrated in FIG. 15. The annealing for forming each of the source region 5 and the base contact region 7 is not necessarily executed simultaneously in the same step, and the respective annealing steps may be executed independently of each other.

Figure 16:
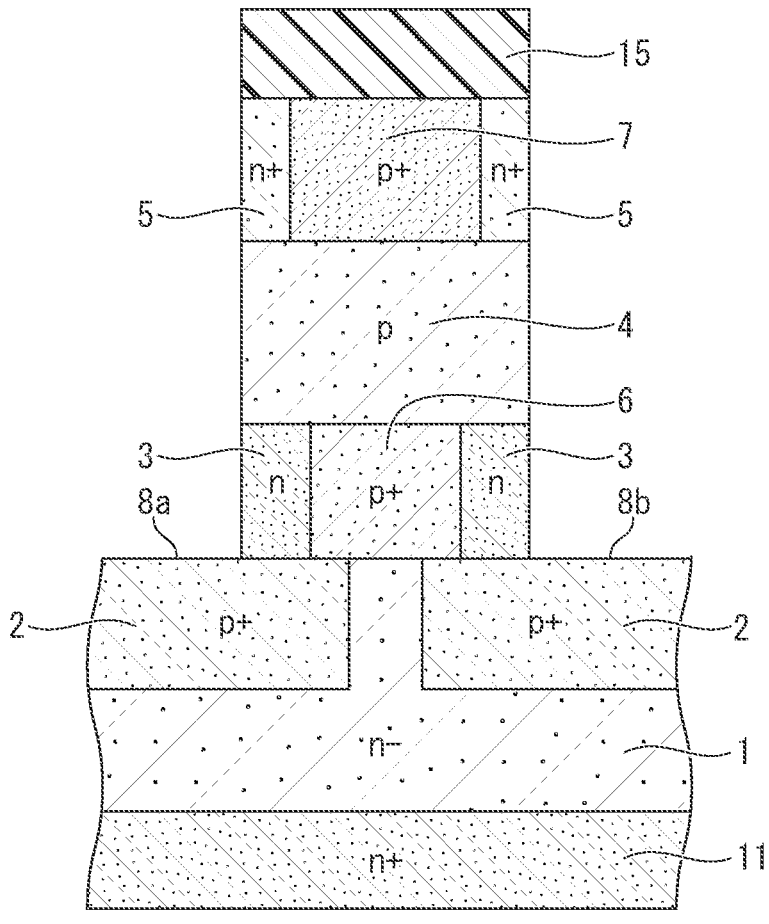
FIG. 16 is a cross-sectional process view continued from FIG. 15 for explaining the example of the method of manufacturing the insulated gate semiconductor device according to the first embodiment.

Next, the photoresist film 15 is applied on the respective top surfaces of the source region 5 and the base contact region 7, and is then delineated by photolithography. Using the delineated photoresist film 15 as a mask for etching, the source region 5, the base region 4, and the current spreading layer 3 are each partly removed in the depth direction by dry etching such as reactive ion etching (RIE) so as to selectively form the trenches 8a and 8b extending to reach the lower buried region 2, as illustrated in FIG. 16. The photoresist film 15 is then removed. Instead of the photoresist film 15, an oxide film may be used to be delineated as the mask for etching.

Figure 17:
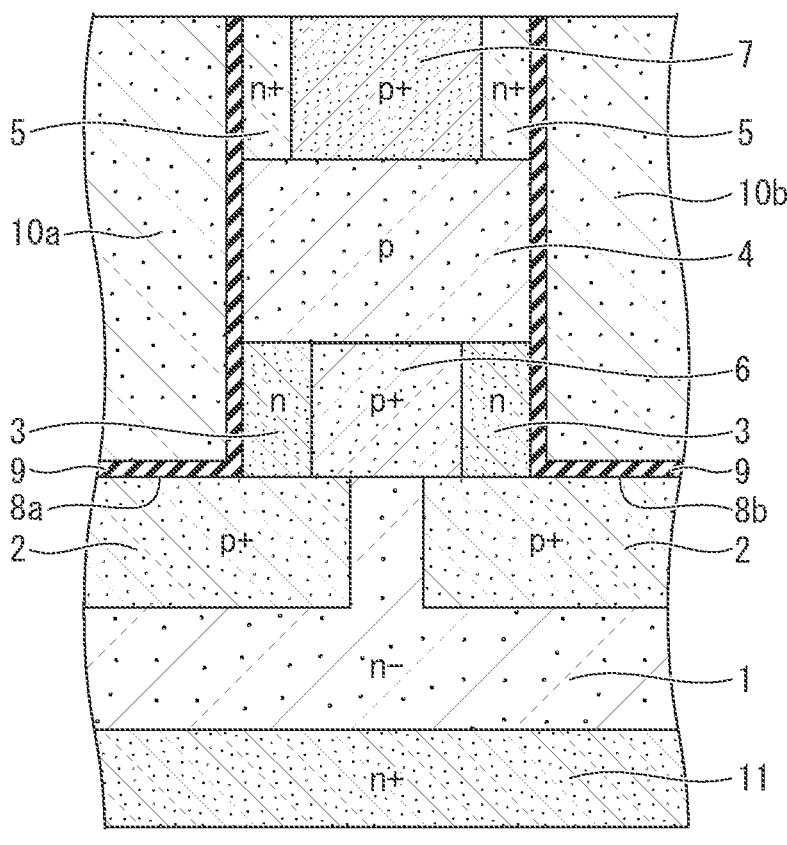
FIG. 17 is a cross-sectional process view continued from FIG. 16 for explaining the example of the method of manufacturing the insulated gate semiconductor device according to the first embodiment.

Next, the gate insulating film 9 is formed on the bottom surfaces and the side surfaces of the trenches 8a and 8b and the respective top surfaces of the source region 5 and the base contact region 7 by a thermal oxidation method or a chemical vapor deposition (CVD) method. The CVD method using dopant gas leads a polysilicon layer (a doped polysilicon layer) with which p-type impurity ions such as Al are heavily doped to be deposited so as to fill the trenches 8a and 8b. The doped polysilicon layer is then selectively removed by photolithography and dry etching. As a result, the patterns of the gate electrodes 10a and 10b formed of the doped polysilicon layer are formed so as to provide the insulated gate structures (9, 10a), (9, 10b), as illustrated in FIG. 17.

Next, the interlayer insulating film 12 is deposited on the top surfaces of the respective insulated gate structures (9, 10a), (9, 10b) by the CVD method, for example. The interlayer insulating film 12 is then selectively removed by photolithography and dry etching. The execution of the subsequent annealing after a deposition of a Ni film on the entire surface by sputtering and the like causes the SiC on the respective surfaces of the source region 5 and the base contact region 7 to react with the Ni film. Removing the Ni film not reacted further forms the source contact layer 13 made from NiSi$_x$ selectively at a part in which the interlayer insulating film 12 is removed. Further, a metal layer such as an Al film is formed on the interlayer insulating film 12 by use of sputtering and the like. The metal layer such as an Al film is then delineated by use of photolithography and RIE so as to form the source electrode 17. The thickness of the drain region 11 is adjusted by chemical mechanical polishing (CMP), for example. The drain electrode 14 made from Au, for example, is then formed on the entire bottom surface of the drain region 11 by sputtering or vapor deposition, for example. The insulated gate semiconductor device according to the first embodiment illustrated in FIG. 1 to FIG. 5 is thus completed.

First Modified Example

Figure 18:
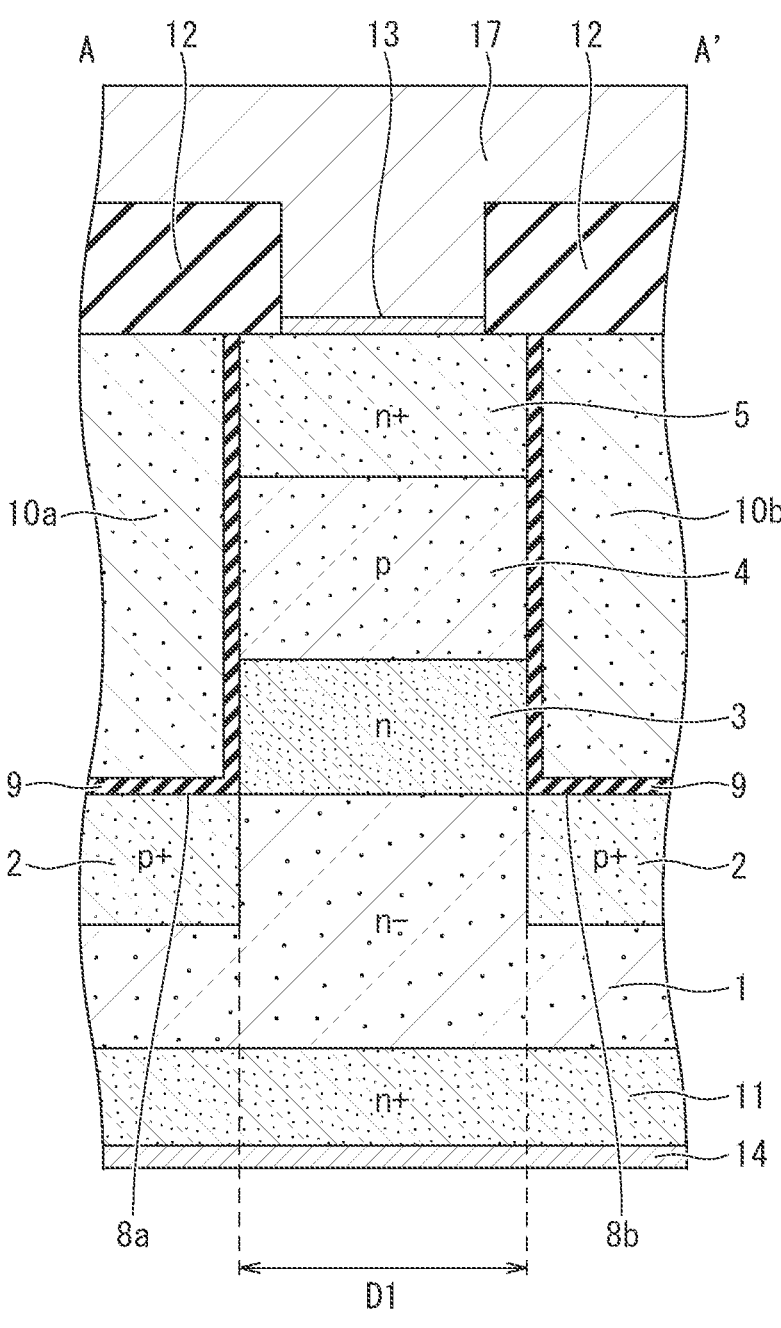
FIG. 18 is a plan view that is an example illustrating a main part of an insulated gate semiconductor device according to a first modified example of the first embodiment.

An insulated gate semiconductor device according to a first modified example of the first embodiment illustrated in FIG. 18 differs from the insulated gate semiconductor device according to the first embodiment in that the gap D1 between the respective positions of the lower buried region 2 separated from each other is greater than the gap D1 illustrated in FIG. 1. FIG. 18 illustrates the case in which the width of the lower buried region 2 is the same as the width of the trenches 8*a* and 8*b*. The gap D1 between the respective positions of the lower buried region 2 separated from each other may be further increased so that the width of the lower buried region 2 is narrower than the width of the trenches 8*a* and 8*b*. The other configurations of the insulated gate semiconductor device according to the first modified example of the first embodiment are the same as those of the insulated gate semiconductor device according to the first embodiment, and overlapping explanations are not repeated below.

The configuration of the insulated gate semiconductor device according to the first modified example of the first embodiment, in which the gap D1 between the respective positions of the lower buried region 2 separated from each other is increased, can increase the area of the junction field effect transistor (JFET) implemented by the drift layer 1 provided between the respective positions of the lower buried region 2. This can reduce the JFET resistance to further reduce the ON resistance accordingly.

Second Modified Example

Figure 19:
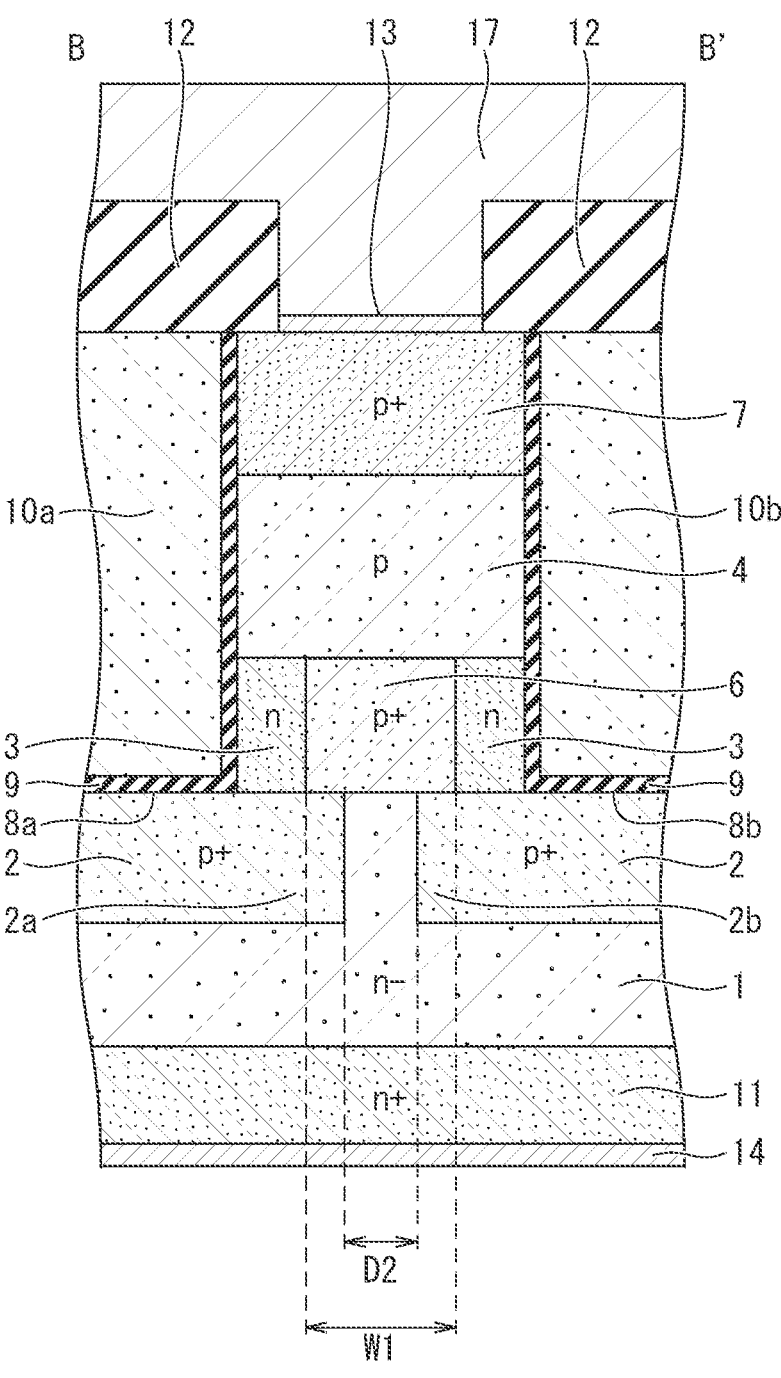
FIG. 19 is a plan view that is an example illustrating a main part of an insulated gate semiconductor device according to a second modified example of the first embodiment.

An insulated gate semiconductor device according to a second modified example of the first embodiment illustrated in FIG. 19 differs from the insulated gate semiconductor device according to the first embodiment illustrated in FIG. 2 in that the side surfaces on both sides of the base contact region 7 are in contact with the respective trenches 8*a* and 8*b*. The other configurations of the insulated gate semiconductor device according to the second modified example of the first embodiment are the same as those of the insulated gate semiconductor device according to the first embodiment, and overlapping explanations are not repeated below.

The configuration of the insulated gate semiconductor device according to the second modified example of the first embodiment, in which the side surfaces on both sides of the base contact region 7 are in contact with the respective trenches 8*a* and 8*b*, can decrease a forward voltage Vf of a body diode implemented by a p-n junction between each of the lower buried region 2 and the upper buried region 6 and the drift layer 1.

Third Modified Example

Figure 20:
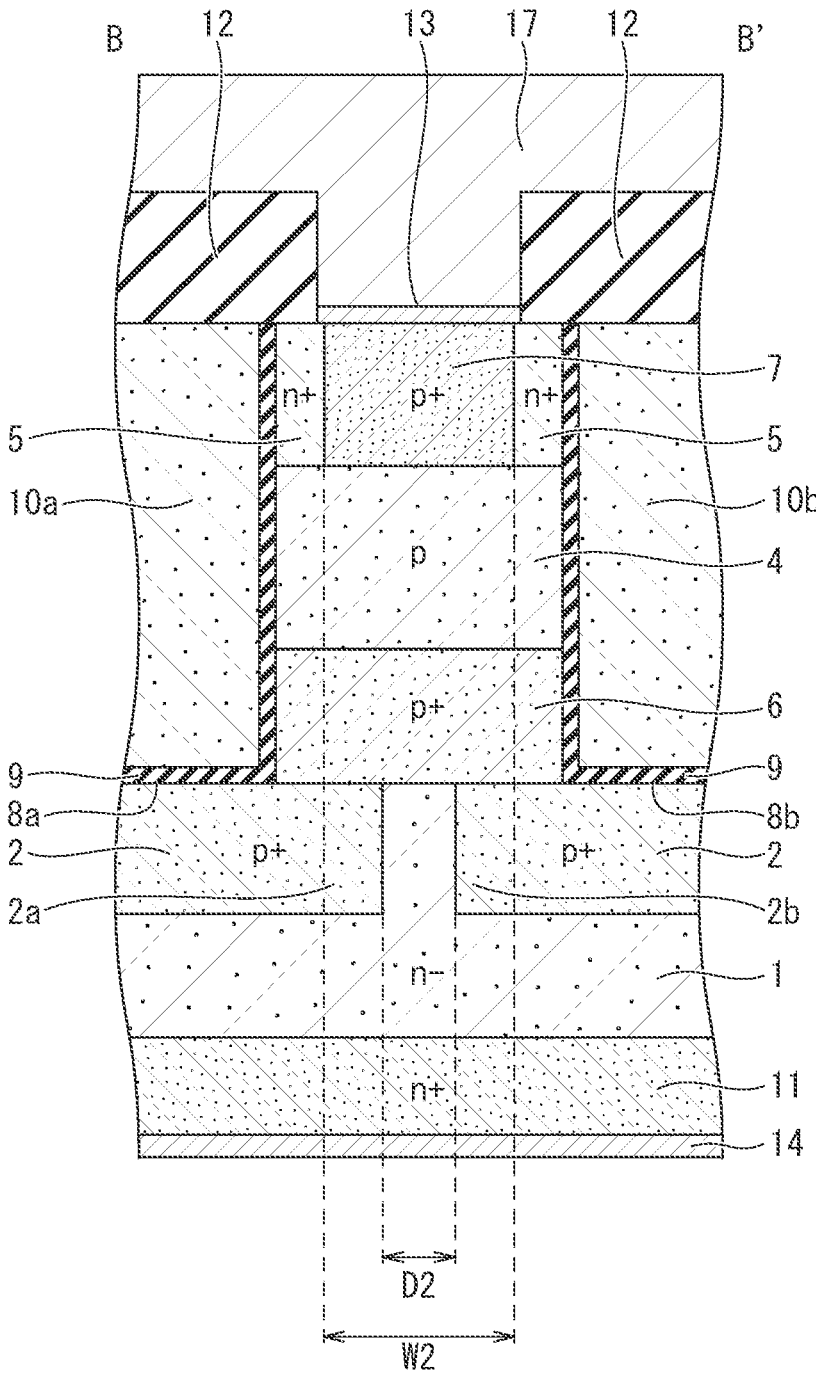
FIG. 20 is a plan view that is an example illustrating a main part of an insulated gate semiconductor device according to a third modified example of the first embodiment.

An insulated gate semiconductor device according to a third modified example of the first embodiment illustrated in FIG. 20 differs from the insulated gate semiconductor device according to the first embodiment illustrated in FIG. 2 in that the side surfaces on both sides of the upper buried region 6 are in contact with the respective trenches 8*a* and 8*b*. The other configurations of the insulated gate semiconductor device according to the third modified example of the first embodiment are the same as those of the insulated gate semiconductor device according to the first embodiment, and overlapping explanations are not repeated below.

The configuration of the insulated gate semiconductor device according to the third modified example of the first embodiment, in which the side surfaces on both sides of the upper buried region 6 are in contact with the respective trenches 8*a* and 8*b*, can decrease the forward voltage Vf of the body diode implemented by the p-n junction between each of the lower buried region 2 and the upper buried region 6 and the drift layer 1.

Fourth Modified Example

Figure 21:
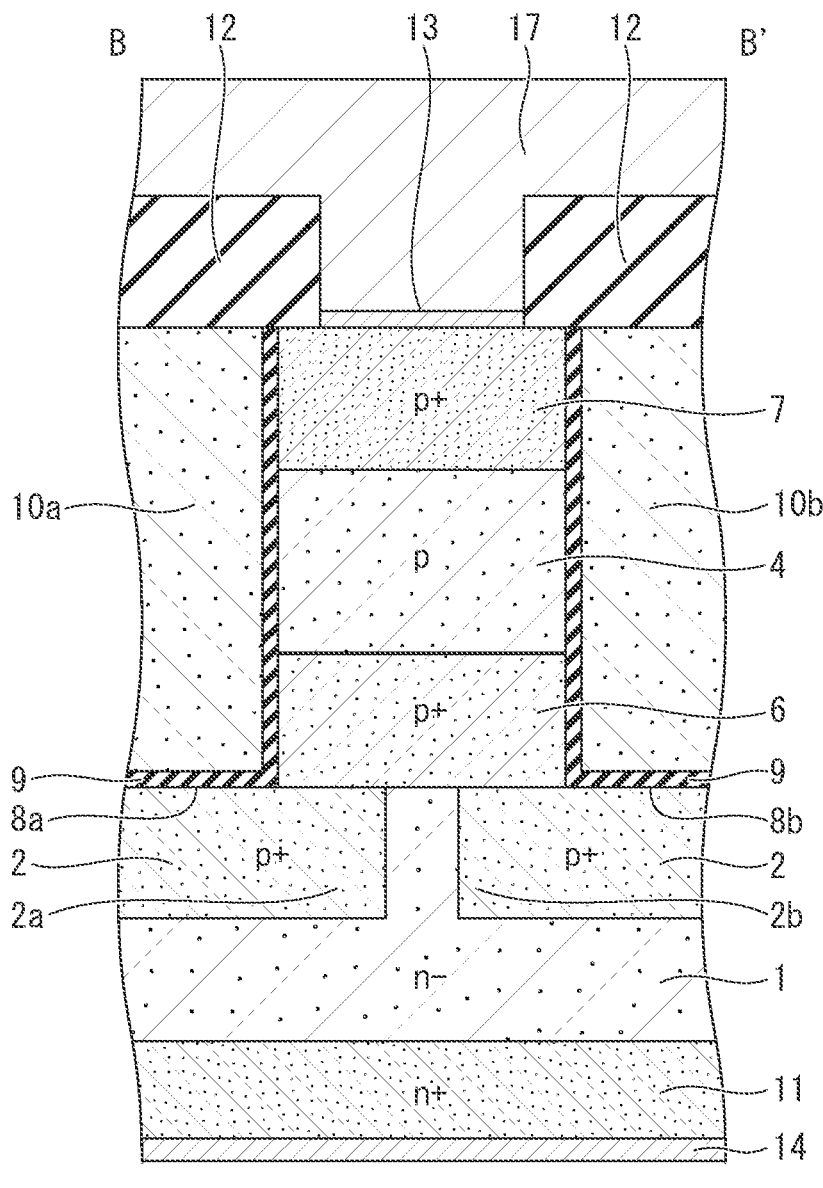
FIG. 21 is a plan view that is an example illustrating a main part of an insulated gate semiconductor device according to a fourth modified example of the first embodiment.

An insulated gate semiconductor device according to a fourth modified example of the first embodiment illustrated in FIG. 21 differs from the insulated gate semiconductor device according to the first embodiment illustrated in FIG. 2 in that the side surfaces on both sides of each of the base contact region 7 and the upper buried region 6 are in contact with the respective trenches 8*a* and 8*b*. The other configurations of the insulated gate semiconductor device according to the fourth modified example of the first embodiment are the same as those of the insulated gate semiconductor device according to the first embodiment, and overlapping explanations are not repeated below.

The configuration of the insulated gate semiconductor device according to the fourth modified example of the first embodiment, in which the side surfaces on both sides of each of the base contact region 7 and the upper buried region 6 are in contact with the respective trenches 8*a* and 8*b*, can decrease the forward voltage Vf of the body diode implemented by the p-n junction between each of the lower buried region 2 and the upper buried region 6 and the drift layer 1.

Fifth Modified Example

Figure 22:
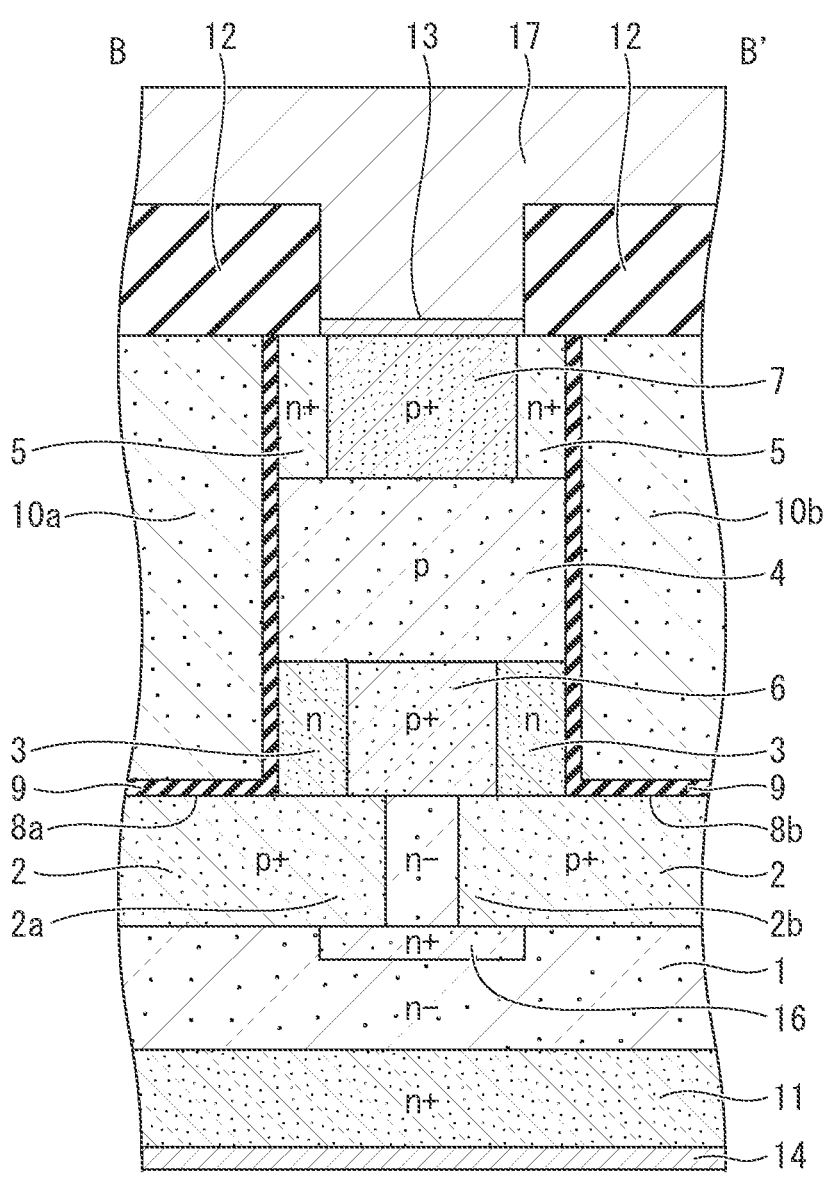
FIG. 22 is a plan view that is an example illustrating a main part of an insulated gate semiconductor device according to a fifth modified example of the first embodiment.

An insulated gate semiconductor device according to a fifth modified example of the first embodiment illustrated in FIG. 22 differs from the insulated gate semiconductor device according to the first embodiment illustrated in FIG. 2 in further including a high-concentration region 16 of $n^+$-type provided in contact with the corner parts of the lower buried region 2. While this example is illustrated with the case in which the high-concentration region 16 is provided across the respective corner parts at the ends of the lower buried region 2 opposed to each other, the high-concentration region 16 may be located separately at the respective corner parts at the ends of the lower buried region 2 opposed to each other. The high-concentration region 16 has an impurity concentration of about $2 \times 10^{17}$ cm$^{-3}$ or greater and $1 \times 10^{18}$ cm$^{-3}$ or less, for example. Although not illustrated, the high-concentration region 16 may have either a dotted-like planar pattern or a stripe-shaped planar pattern. The other configurations of the insulated gate semiconductor device according to the fifth modified example of the first embodiment are the same as those of the insulated gate semiconductor device according to the first embodiment, and overlapping explanations are not repeated below.

The configuration of the insulated gate semiconductor device according to the fifth modified example of the first embodiment, which further includes the $n^+$-type high-concentration region 16, can lead the current to be concentrated limitedly (locally) at the corner parts of the lower buried region 2, so as to cause an avalanche breakdown.

Second Embodiment

Figure 23:
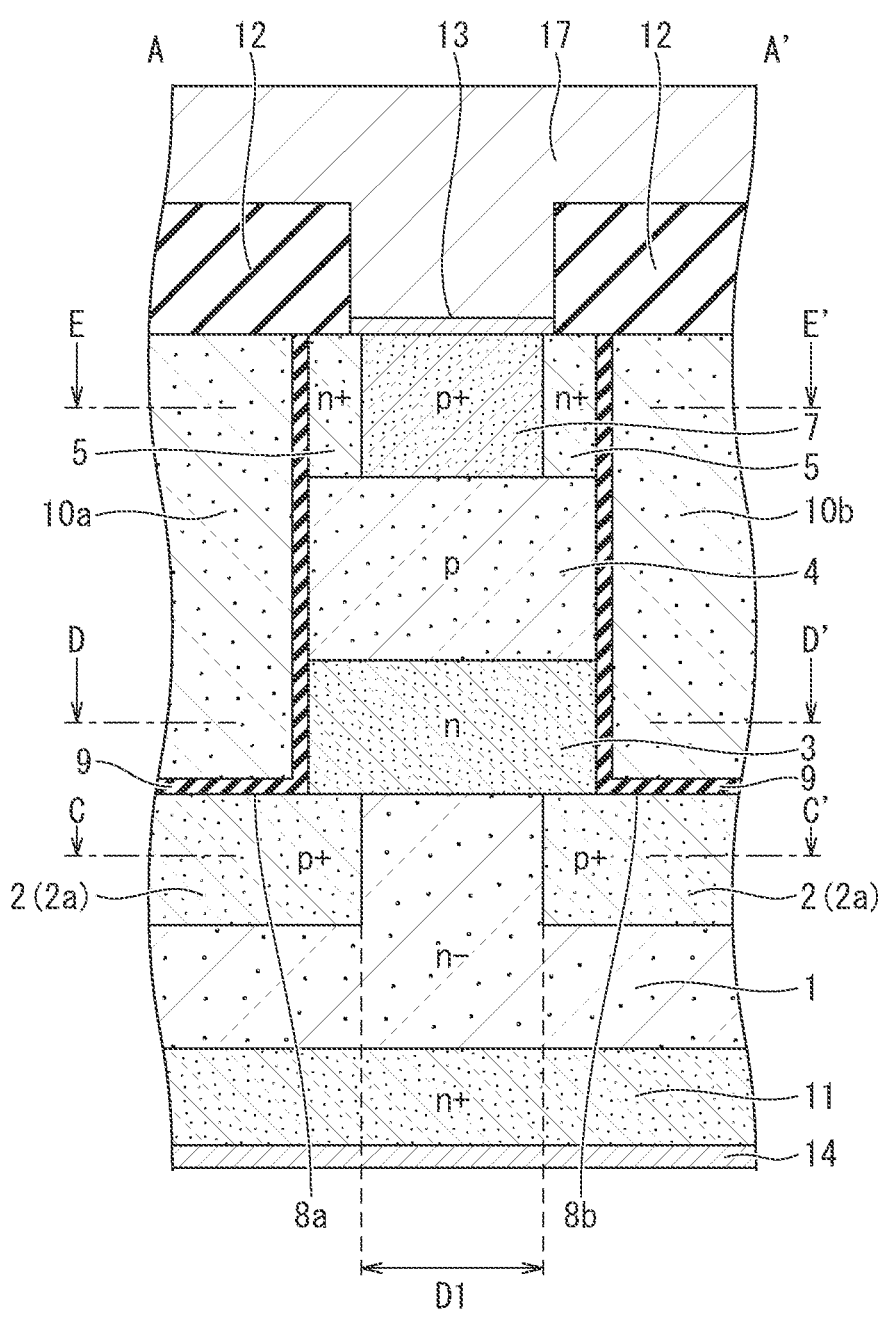
FIG. 23 is a cross-sectional view that is an example illustrating a main part of an insulated gate semiconductor device according to a second embodiment.
Figure 24:
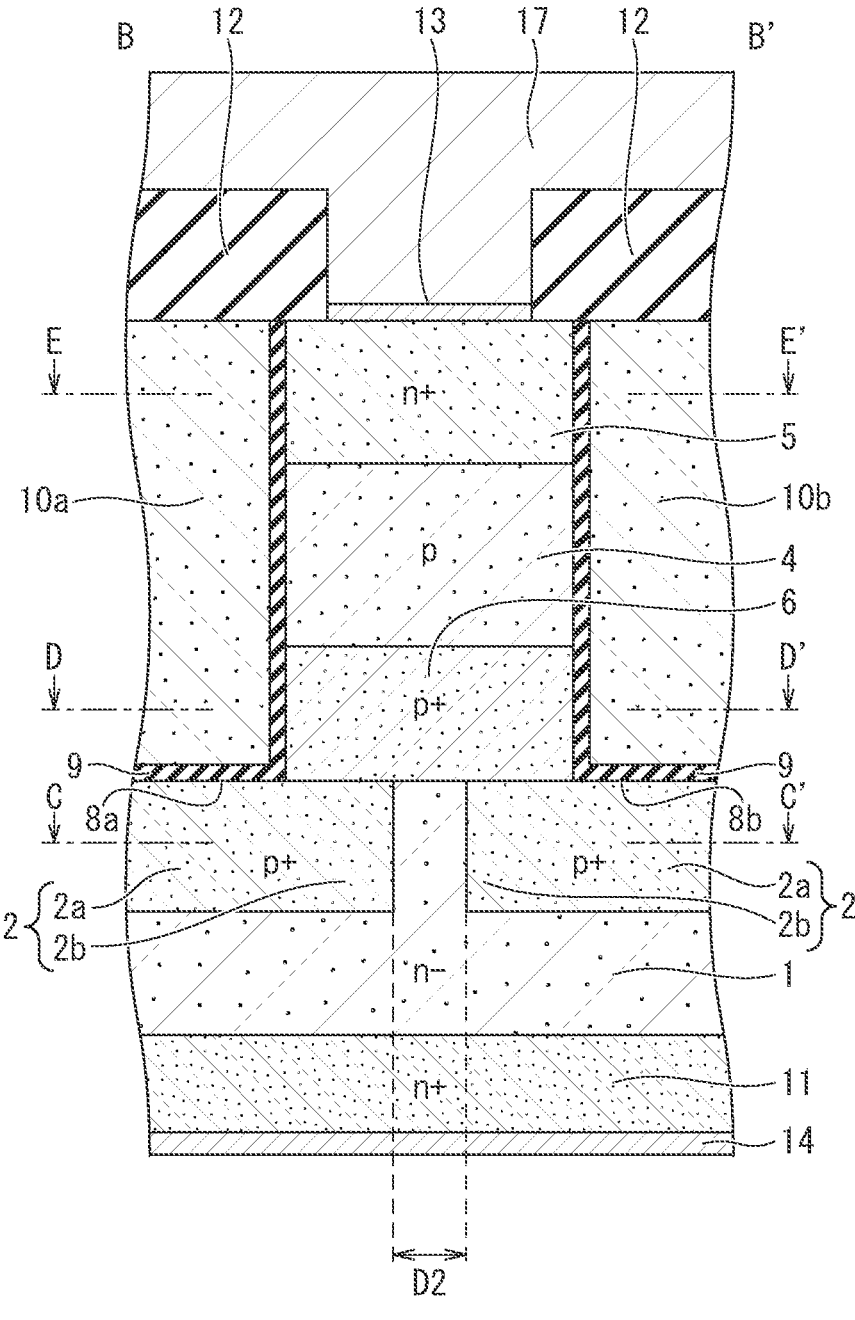
FIG. 24 is a cross-sectional view that is an example illustrating another main part of the insulated gate semiconductor device according to the second embodiment.
Figure 25:
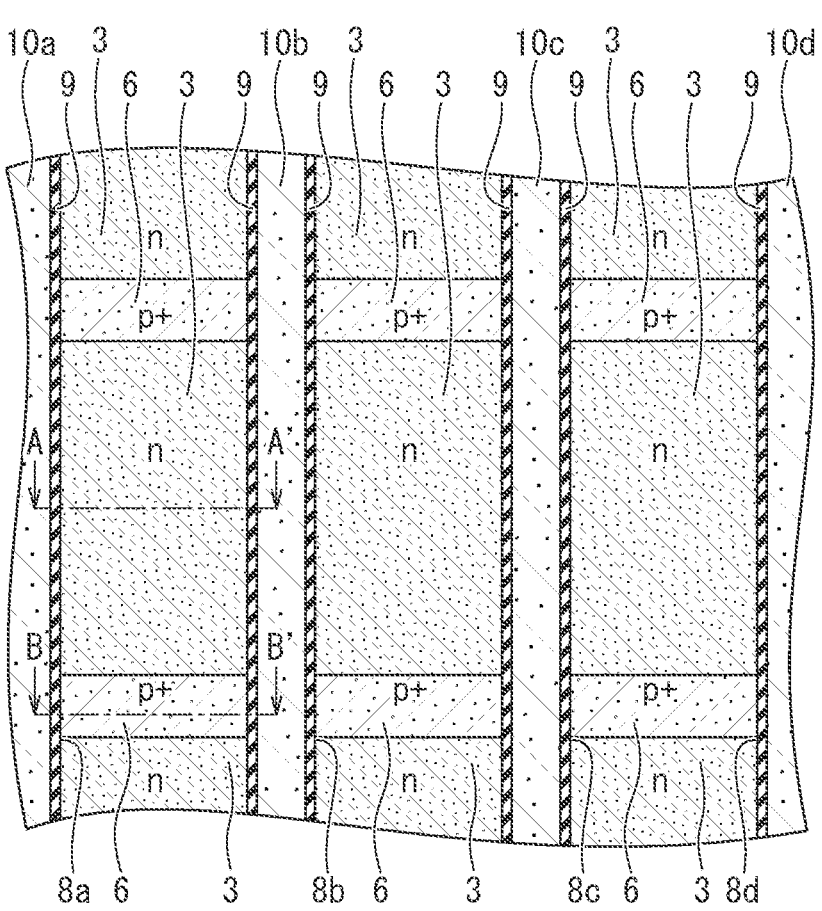
FIG. 25 is a cross-sectional view in the horizontal direction as viewed from direction D-D' in FIG. 23 and FIG. 24.
Figure 26:
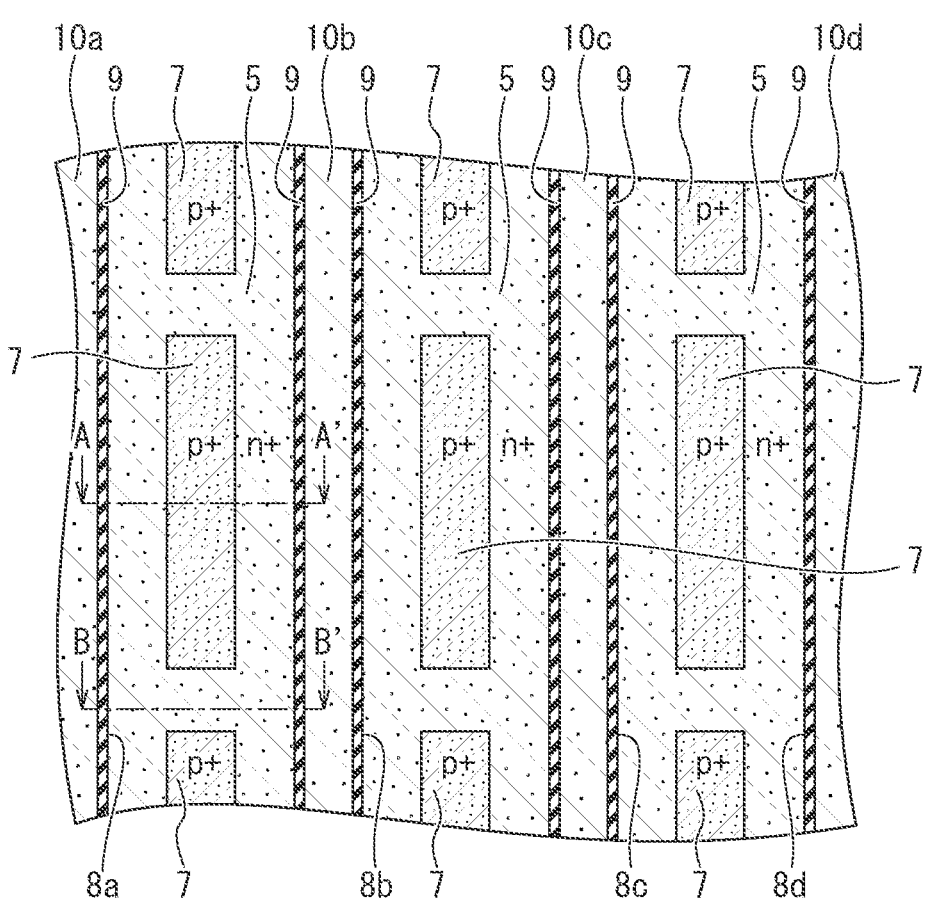
FIG. 26 is a cross-sectional view in the horizontal direction as viewed from direction E-E' in FIG. 23 and FIG. 24.

FIG. 23 and FIG. FIG. 24 are each a cross-sectional view illustrating a main part of an insulated gate semiconductor device according to a second embodiment of the present invention. The cross-sectional view (the planar layout) in the horizontal direction as viewed from direction C-C' in FIG. 23 and FIG. 24 conforms to FIG. 3. FIG. 25 corresponds to the cross-sectional view (the planar layout) in the horizontal direction as viewed from direction D-D' in FIG. 23 and FIG. 24. FIG. 26 corresponds to the cross-sectional view (the planar layout) in the horizontal direction as viewed from direction E-E' in FIG. 23 and FIG. 24. FIG. 23 corresponds to the cross-sectional view in the vertical direction as viewed from direction A-A' in FIG. 25 and FIG. 26, and FIG. 24 corresponds to the cross-sectional view in the vertical direction as viewed from direction B-B' in FIG. 25 and FIG. 26.

The insulated gate semiconductor device according to the second embodiment differs from the insulated gate semiconductor device according to the first embodiment illustrated in FIG. 1 and FIG. 2 in that the base contact region 7 is deposited over the current spreading layer 3 as viewed in the cross section in which the upper buried region 6 is not provided, as illustrated in FIG. 23, and in that the base contact region 7 is not deposited over the upper buried region 6 as viewed in the cross section in which the upper buried region 6 is provided, as illustrated in FIG. 24.

As illustrated in FIG. 25, the upper buried region 6 has a rectangular planar pattern extending in the direction perpendicular to the extending direction of the trenches 8a to 8d. The both ends of the upper buried region 6 are in contact with the respective trenches 8a to 8d in the direction perpendicular to the extending direction of the trenches 8a to 8d. The upper buried region 6 is arranged to be located at several positions at intervals in the extending direction of the trenches 8a to 8d.

As illustrated in FIG. 26, the base contact region 7 has a stripe-shaped planar pattern extending parallel to the extending direction of the respective trenches 8a to 8d. The base contact region 7 is arranged to be located at several positions at intervals in the extending direction of the trenches 8a to 8d. The respective positions of the base contact region 7 are located so as not to overlap with the upper buried region 6 illustrated in FIG. 25. The source region 5 deposited between the respective positions of the base contact region 7 is located at a part overlapping with the upper buried region 6 illustrated in FIG. 25. The other configurations of the insulated gate semiconductor device according to the second embodiment are the same as those of the insulated gate semiconductor device according to the first embodiment, and overlapping explanations are not repeated below.

The configuration of the insulated gate semiconductor device according to the second embodiment, in which the upper buried region 6 and the base contact region 7 are arranged so as not to overlap with each other, can increase the distance of the current flowing through the base contact region 7, the base region 4, and the upper buried region 6. Regulating the concentration in the base region 4 can adjust the forward voltage Vf of the body diode implemented by the p-n junction between each of the lower buried region 2 and the upper buried region 6 and the drift layer 1.

Third Embodiment

Figure 27:
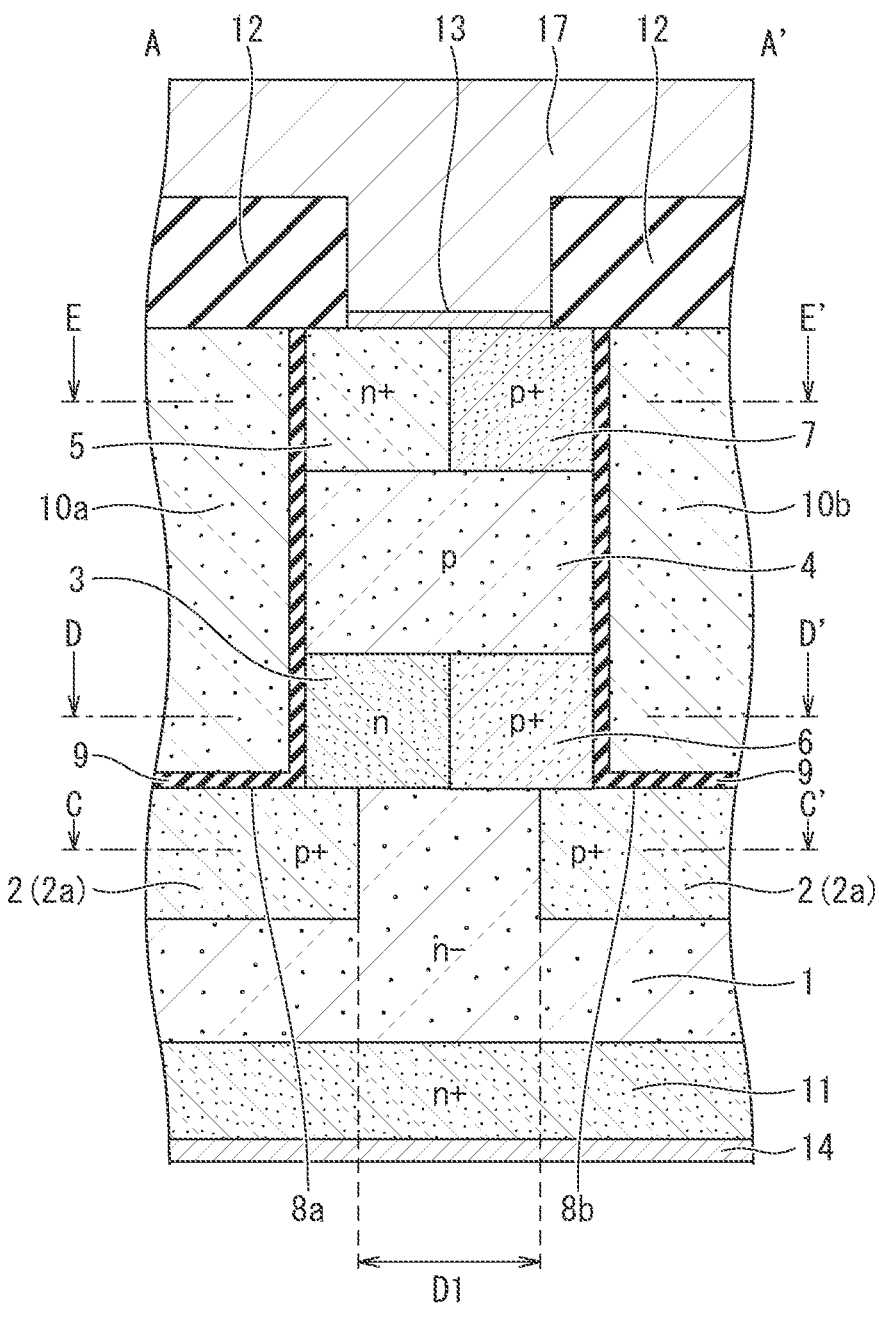
FIG. 27 is a cross-sectional view that is an example illustrating a main part of an insulated gate semiconductor device according to a third embodiment.
Figure 28:
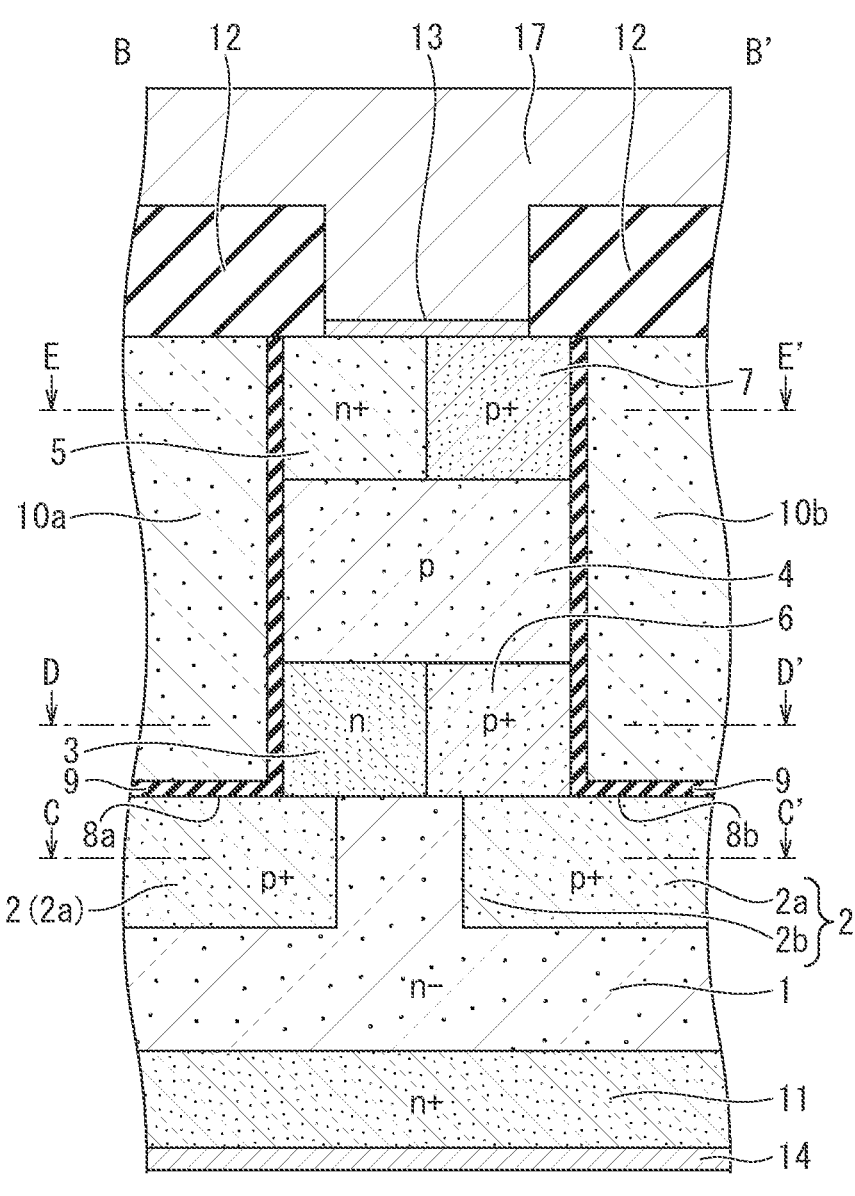
FIG. 28 is a cross-sectional view that is an example illustrating another main part of the insulated gate semiconductor device according to the third embodiment.
Figure 29:
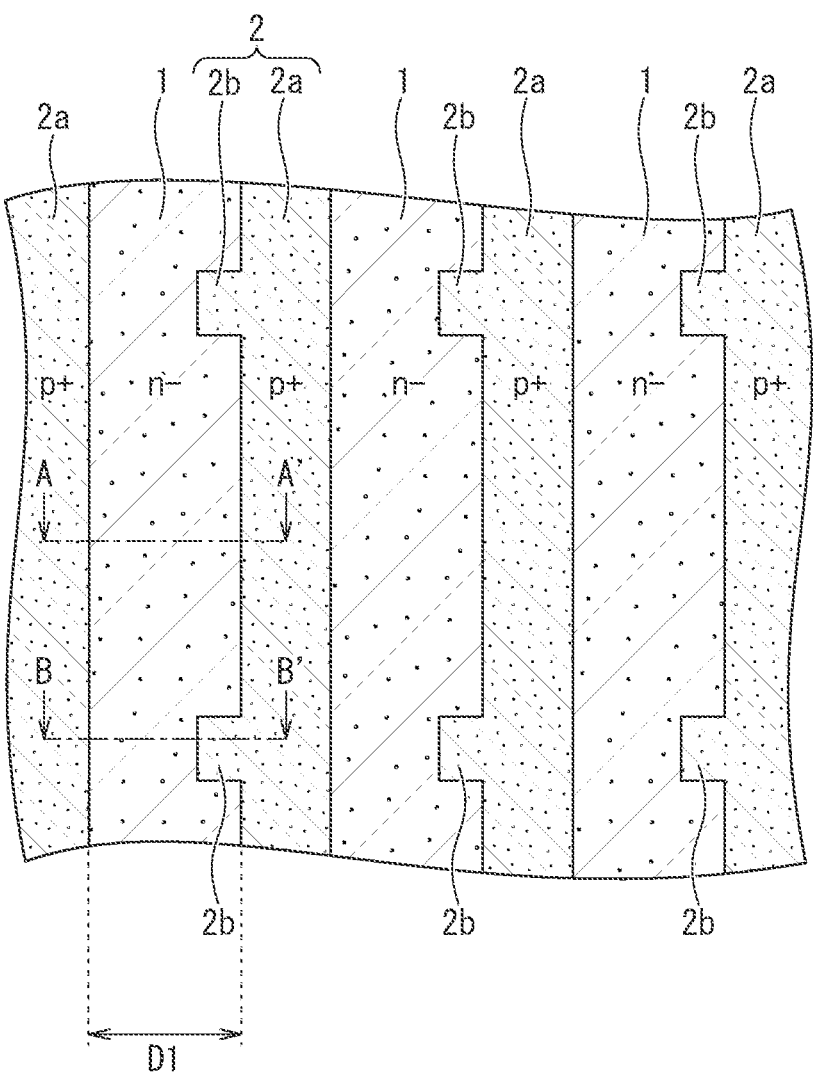
FIG. 29 is a cross-sectional view in the horizontal direction as viewed from direction C-C' in FIG. 27 and FIG. 28.
Figure 30:
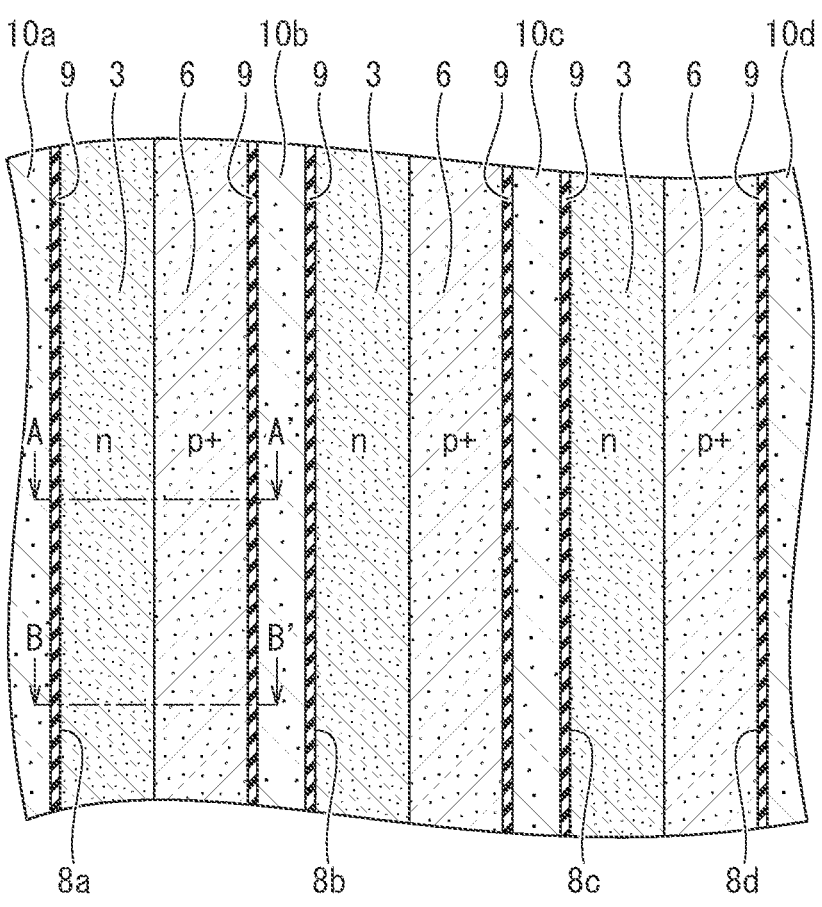
FIG. 30 is a cross-sectional view in the horizontal direction as viewed from direction D-D' in FIG. 27 and FIG. 28.
Figure 31:
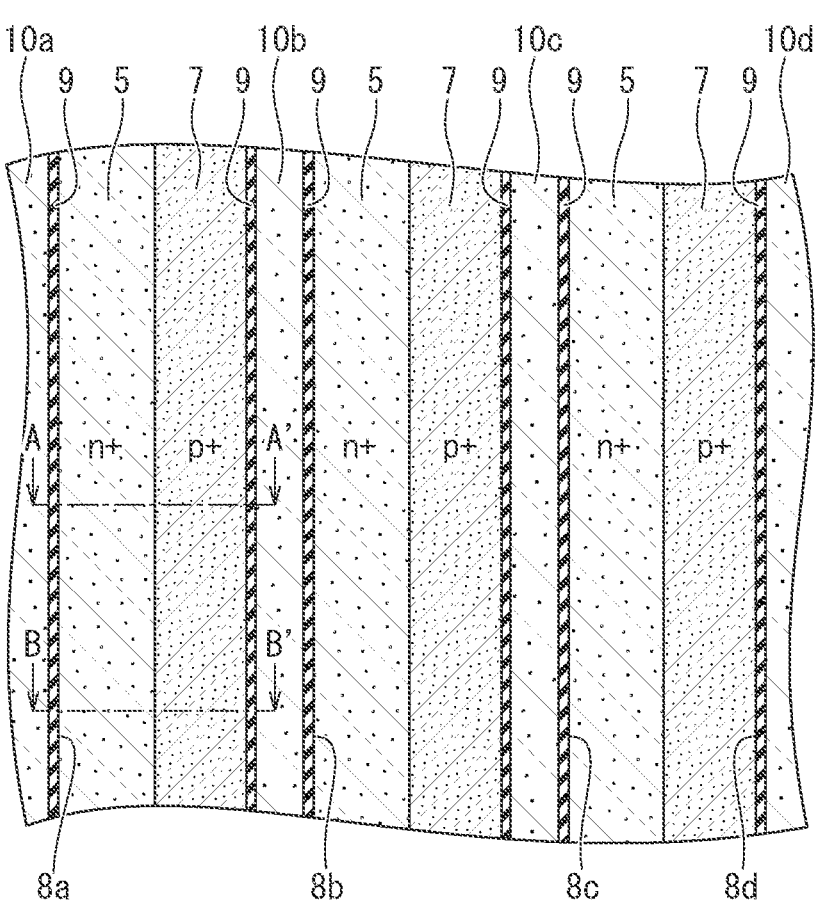
FIG. 31 is a cross-sectional view in the horizontal direction as viewed from direction E-E' in FIG. 27 and FIG. 28.

FIG. 27 and FIG. FIG. 28 are each a cross-sectional view illustrating a main part of an insulated gate semiconductor device according to a third embodiment of the present invention. FIG. 29 corresponds to the cross-sectional view (the planar layout) in the horizontal direction as viewed from direction C-C' in FIG. 27 and FIG. FIG. 28. FIG. 30 corresponds to the cross-sectional view (the planar layout) in the horizontal direction as viewed from direction D-D' in FIG. 27 and FIG. FIG. 28. FIG. 31 corresponds to the cross-sectional view (the planar layout) in the horizontal direction as viewed from direction E-E' in FIG. 27 and FIG. FIG. 28. FIG. 27 corresponds to the cross-sectional view in the vertical direction as viewed from direction A-A' in FIG. 29 to FIG. 31, and FIG. 28 corresponds to the cross-sectional view in the vertical direction as viewed from direction B-B' in FIG. 29 to FIG. 31.

The insulated gate semiconductor device according to the third embodiment illustrated in FIG. 27 and FIG. 28 differs from the insulated gate semiconductor device according to the first embodiment illustrated in FIG. 1 to FIG. 5 in that the upper buried region 6 and the base contact region 7 are in contact with only the trench 8b that is one of the trenches 8a and 8b adjacent to each other. The upper buried region 6 and the base contact region 7 are provided to overlap with each other. The current spreading layer 3 is in contact with the upper buried region 6 so as to be in contact with the other trench 8a. The source region 5 is in contact with the base contact region 7 so as to be in contact with the other trench 8a.

A semiconductor wafer in which the trenches 8a and 8b are provided has an off-angle θ1 of about 4 to 8 degrees in the <11-20> direction with respect to the <0001> (c-axis) direction, for example. When the a-plane that is the (11-20) plane is used as the respective side wall surfaces opposed to the trenches 8a and 8b, the inclined angle to the a-plane on one of the side wall surfaces of the trenches 8a and 8b is different from the inclined angle to the a-plane on the other side wall surface because of the structure of the semiconductor wafer having the off-angle θ1. Since the a-plane has a higher rate of electron transfer as being inclined toward the Si plane side, the rate of the electron transfer on one of the side wall surfaces of the trenches 8a and 8b is greater than that on the other side wall surface. The insulated gate semiconductor device according to the third embodiment thus has the configuration in which the upper buried region 6 and the base contact region 7 are in contact with the side wall surface of the trench 8b having the higher rate of the electron transfer.

As illustrated in FIG. 29, the lower buried region 2 includes a plurality of stripe parts 2a extending parallel to each other in the vertical direction in FIG. 29, and projecting parts 2b projecting on one side of the respective stripe parts 2a in the direction perpendicular to the direction in which the respective stripe parts 2a extend. While the present embodiment illustrates the case in which the width of the respective stripe parts 2a is greater than the width of the respective trenches 8a and 8b illustrated in FIG. 27 and FIG. 28, the width of the respective stripe parts 2a may be either the same as or narrower than the width of the respective trenches 8a and 8b.

As illustrated in FIG. 30, the upper buried region 6 has a stripe-shaped planar pattern extending parallel to the extending direction of the respective trenches 8a to 8d. The upper buried region 6 is in contact with the side wall on the left side of the respective trenches 8b to 8d, and is separated from the side wall on the right side of the respective trenches 8a to 8c. The upper buried region 6 is arranged to overlap with the respective positions of the projecting parts 2b of the lower buried region 2 illustrated in FIG. 29.

As illustrated in FIG. 31, the base contact region 7 has a stripe-shaped planar pattern extending parallel to the extending direction of the respective trenches 8a to 8d. The base contact region 7 is in contact with the side wall on the left side of the respective trenches 8b to 8d, and is separated from the side wall on the right side of the respective trenches 8a to 8c. The base contact region 7 is arranged to overlap with the respective positions of the projecting parts 2*b* of the lower buried region 2 illustrated in FIG. 29 and the upper buried region 6 illustrated in FIG. 30. The other configurations of the insulated gate semiconductor device according to the third embodiment are the same as those of the insulated gate semiconductor device according to the first embodiment, and overlapping explanations are not repeated below.

The configuration of the insulated gate semiconductor device according to the third embodiment, in which the upper buried region 6 and the base contact region 7 are in contact with only one side of the trenches 8*b* to 8*d* of the trenches 8*a* to 8*d* adjacent to each other, can use only the side wall surfaces having the higher rate of the electron transfer among the trenches 8*a* to 8*d*. This can increase the ON voltage of the insulated gate semiconductor device according to the third embodiment.

Fourth Embodiment

Figure 32:
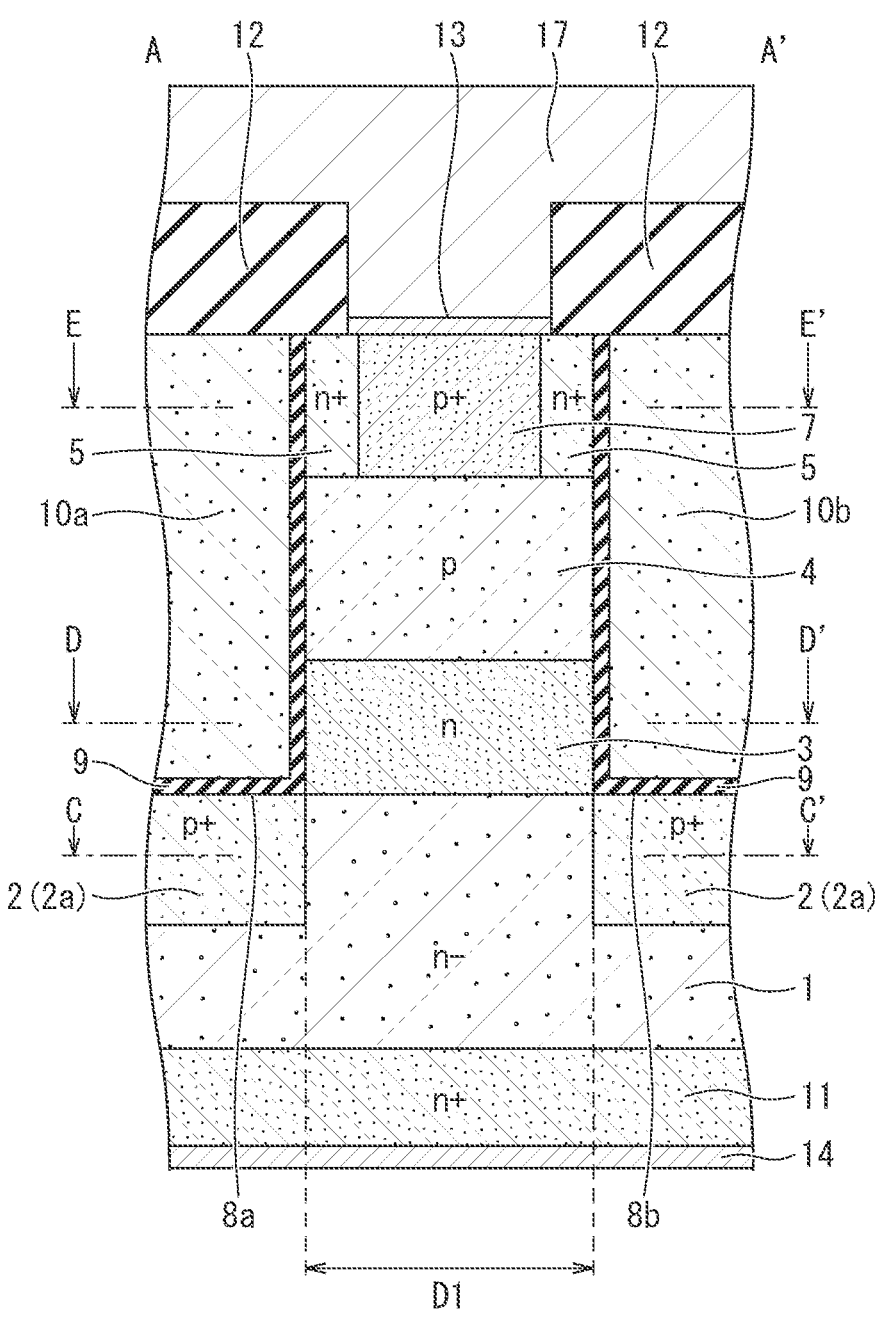
FIG. 32 is a cross-sectional view that is an example illustrating a main part of an insulated gate semiconductor device according to a fourth embodiment.
Figure 33:
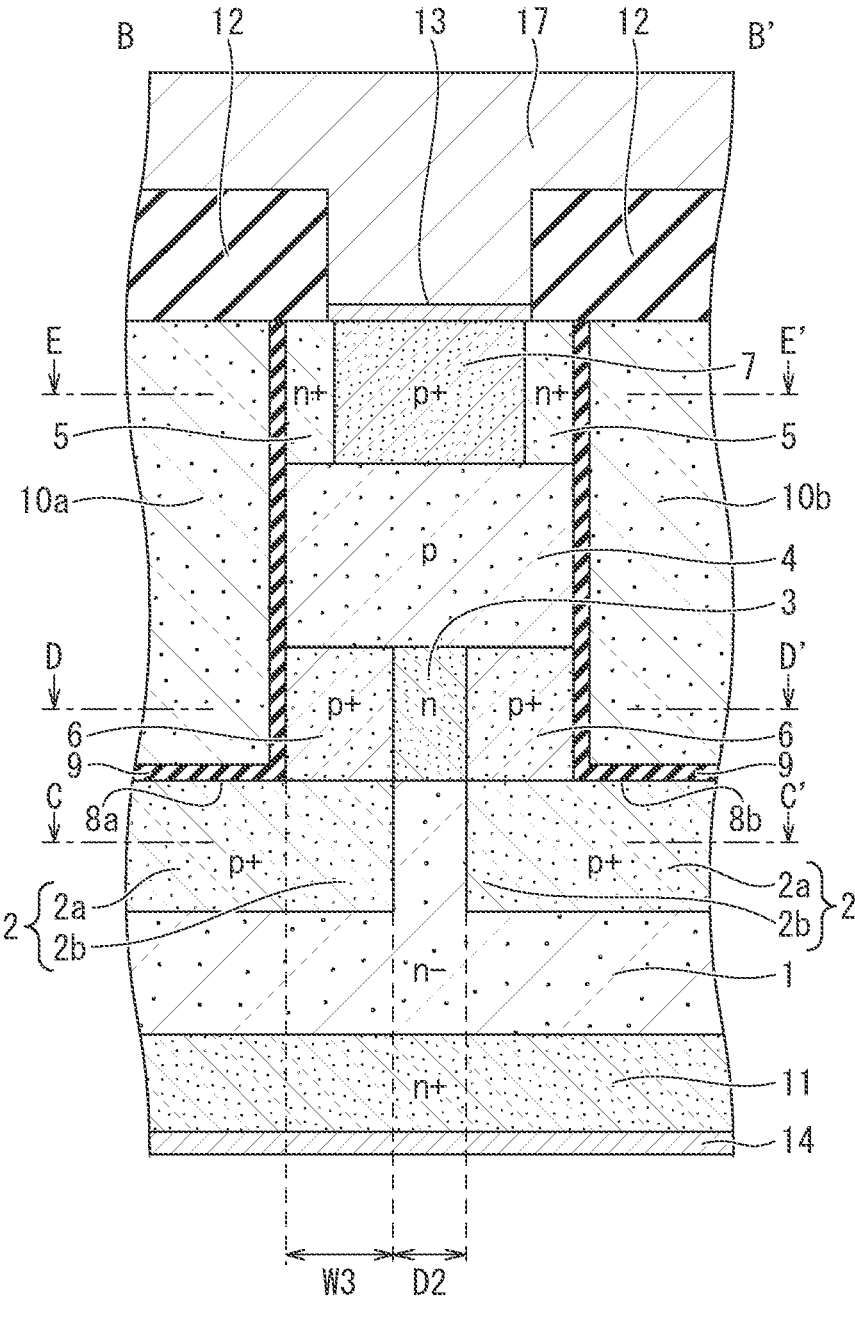
FIG. 33 is a cross-sectional view that is an example illustrating another main part of the insulated gate semiconductor device according to the fourth embodiment.
Figure 34:
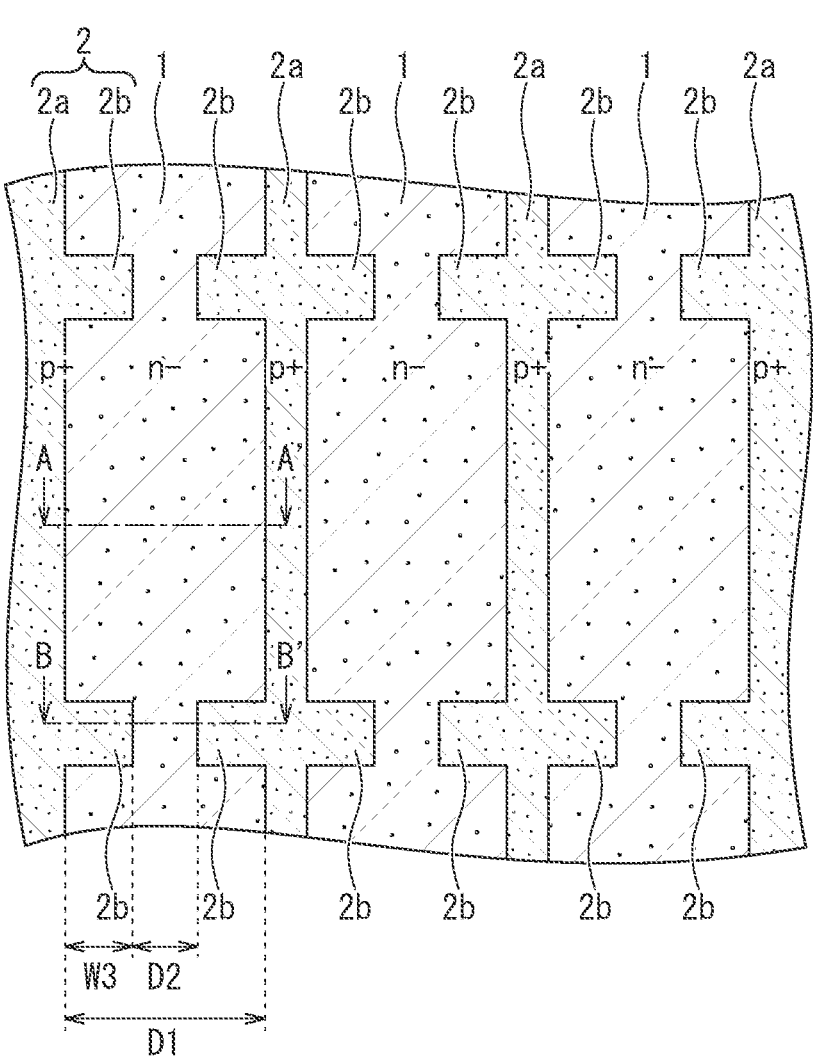
FIG. 34 is a cross-sectional view in the horizontal direction as viewed from direction C-C' in FIG. 32 and FIG. 33.
Figure 35:
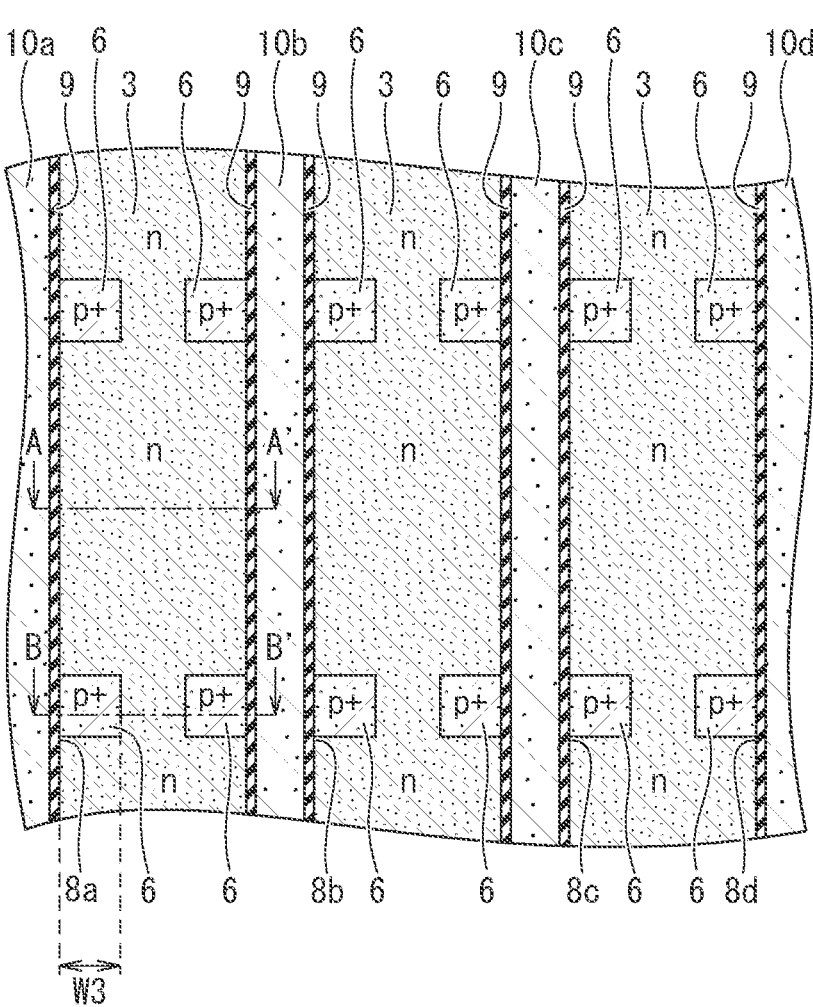
FIG. 35 is a cross-sectional view in the horizontal direction as viewed from direction D-D' in FIG. 32 and FIG. 33.
Figure 36:
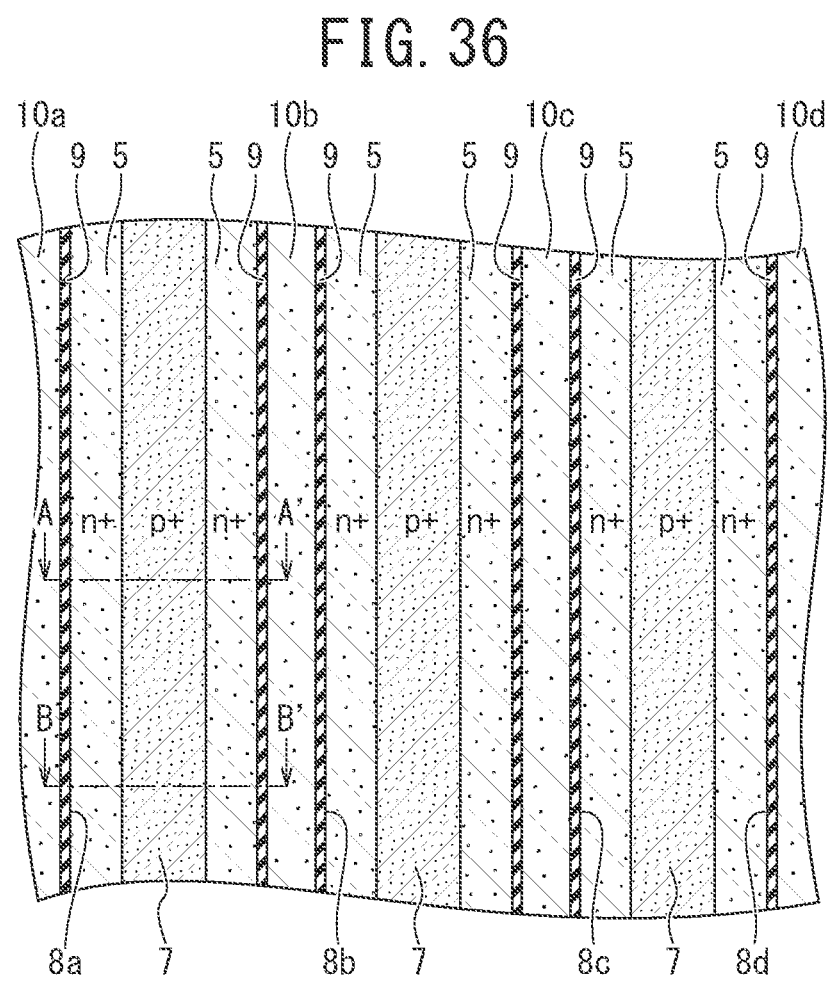

FIG. 32 and FIG. FIG. 33 are each a cross-sectional view illustrating a main part of an insulated gate semiconductor device according to a fourth embodiment of the present invention. FIG. 34 corresponds to the cross-sectional view (the planar layout) in the horizontal direction as viewed from direction C-C' in FIG. 32 and FIG. FIG. 33. FIG. 35 corresponds to the cross-sectional view (the planar layout) in the horizontal direction as viewed from direction D-D' in FIG. 32 and FIG. FIG. 33. FIG. 36 corresponds to the cross-sectional view (the planar layout) in the horizontal direction as viewed from direction E-E' in FIG. 32 and FIG. FIG. 33. FIG. 32 corresponds to the cross-sectional view in the vertical direction as viewed from direction A-A' in FIG. 34 to FIG. 36, and FIG. 33 corresponds to the cross-sectional view in the vertical direction as viewed from direction B-B' in FIG. 34 to FIG. 36.

The insulated gate semiconductor device according to the fourth embodiment illustrated in FIG. 33 differs from the insulated gate semiconductor device according to the first embodiment illustrated in FIG. 2 in that the upper buried region 6 is divided between the trenches 8*a* and 8*b* adjacent to each other. The divided parts of the upper buried region 6 are separated from each other with the current spreading layer 3 interposed, and are in contact with the respective trenches 8*a* and 8*b*. The divided parts of the upper buried region 6 and the projecting parts 2*b* of the lower buried region 2 have the same width W3. As illustrated in the cross-sectional view of FIG. 32, the stripe parts 2*a* of the lower buried region 2 are located immediately under the trenches 8*a* and 8*b*.

As illustrated in FIG. 34, the lower buried region 2 includes the stripe parts 2*a* extending parallel to each other, and the projecting parts 2*b* projecting in the direction perpendicular to the extending direction of the stripe parts 2*a*.

As illustrated in FIG. 35, the respective trenches 8*a* to 8*d* extend parallel to each other in the planar pattern. The trenches 8*a* to 8*d* are located at the positions overlapping with the stripe parts 2*a* illustrated in FIG. 34. The width of the respective trenches 8*a* to 8*d* is the same as or greater than the width of the stripe parts 2*a* illustrated in FIG. 34. The upper buried region 6 has a rectangular planar pattern arranged to have the parts divided in the direction perpendicular to the extending direction of the trenches 8*a* to 8*d*. The respective rectangular parts of the upper buried region 6 are provided to have the same shape as the projecting parts 2*b* of the lower buried region 2 at the positions overlapping with the projecting parts 2*b* illustrated in FIG. 34.

As illustrated in FIG. 36, the base contact region 7 has a stripe-shaped planar pattern extending parallel to the extending direction of the respective trenches 8*a* to 8*d*. The base contact region 7 is arranged to be located separately from the trenches 8*a* to 8*d*. The other configurations of the insulated gate semiconductor device according to the fourth embodiment are the same as those of the insulated gate semiconductor device according to the first embodiment, and overlapping explanations are not repeated below.

As described above, the insulated gate semiconductor device according to the fourth embodiment has the configuration in which the respective parts of the upper buried region 6 and the projecting parts 2*b* of the lower buried region 2 have the same shape in the planar pattern, and the stripe parts 2*a* of the lower buried region 2 are located immediately under the respective trenches 8*a* to 8*d*. This configuration enables the use of the common mask upon the manufacture of the insulated gate semiconductor device according to the fourth embodiment to execute both the ion implantation for forming the upper buried region 6 and the ion implantation for forming the base contact region 7, so as to reduce the cost required during the process as compared with a case of using different masks.

The use of the common mask to execute the single ion implantation enables the formation of the smoother ion-implantation profile than the case of using the two masks to execute the ion implantation two times. This avoids or decreases the influence of the concentration gradient of the ion-implantation profile, so as to decrease the forward voltage Vf of the body diode. Further, the use of the common mask to execute the single ion implantation can prevent the positioning displacement between different masks, so as to avoid a difference or defective in characteristics.

Fifth Embodiment

Figure 37:
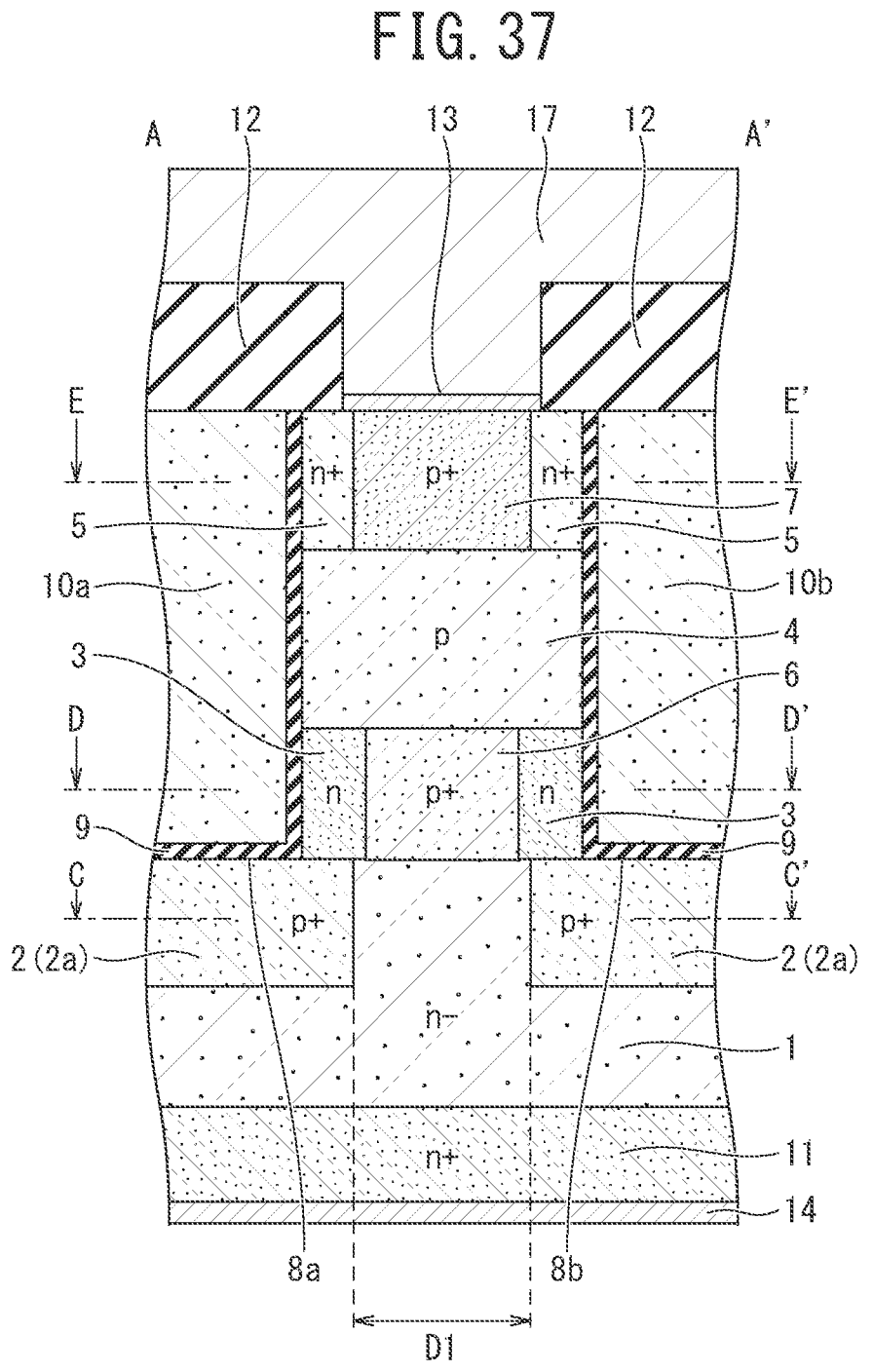
Figure 38:
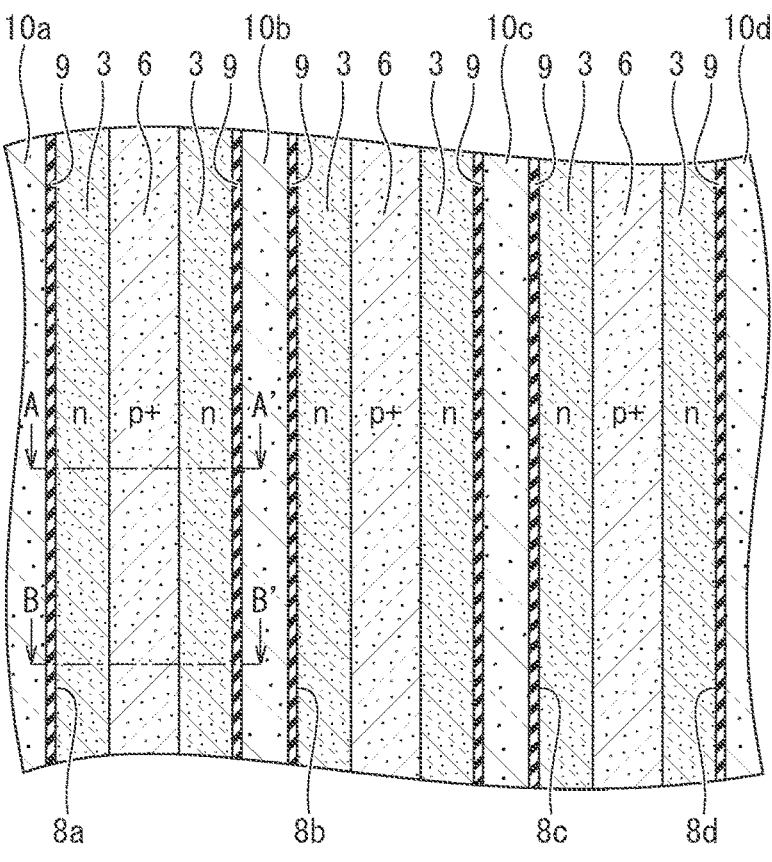
FIG. 38 is a cross-sectional view in the horizontal direction as viewed from direction D-D' in FIG. 37.

FIG. 37 is a cross-sectional view illustrating a main part of an insulated gate semiconductor device according to a fifth embodiment of the present invention. The cross-sectional view (the planar layout) in the horizontal direction as viewed from direction C-C' in FIG. 37 conforms to FIG. 3. FIG. 38 corresponds to the cross-sectional view (the planar layout) in the horizontal direction as viewed from direction D-D' in FIG. 37. The cross-sectional view (the planar layout) in the horizontal direction as viewed from direction E-E' in FIG. 37 conforms to FIG. 36. The cross-sectional view in the vertical direction as viewed from direction A-A' in FIG. 38 corresponds to FIG. 37. The cross-sectional view in the vertical direction as viewed from direction B-B' in FIG. 38 conforms to FIG. 2.

The insulated gate semiconductor device according to the fifth embodiment illustrated in FIG. 36, FIG. 37, and FIG. 38 differs from the insulated gate semiconductor device according to the first embodiment illustrated in FIG. 1 to FIG. 5 in that the upper buried region 6 and the base contact region 7 each have a stripe-shaped planar pattern extending parallel to the extending direction of the trenches 8*a* to 8*d*. The upper buried region 6 and the base contact region 7 are each arranged separately from the respective trenches 8*a* to 8*d*, and are located at the positions overlapping with each other. The other configurations of the insulated gate semiconductor device according to the fifth embodiment are the same as those of the insulated gate semiconductor device according to the first embodiment, and overlapping explanations are not repeated below.

The configuration of the insulated gate semiconductor device according to the fifth embodiment, in which the upper buried region 6 is separated from the trenches 8a and 8b, can lead the current flowing through the upper buried region 6 to be insulated from the gate insulating film 9 so as to protect the gate insulating film 9. Further, the configuration of the upper buried region 6 and the base contact region 7, which overlap with each other and each extend in the stripe shape, increases the contact area between the upper buried region 6 and the base contact region 7, so as to relax the current concentration. This can decrease the forward voltage Vf of the body diode implemented by the p-n junction between each of the lower buried region 2 and the upper buried region 6 and the drift layer 1, so as to increase the breakdown voltage accordingly.

Further, the arrangement of the upper buried region 6 and the base contact region 7 to include stripe parts can avoid the influence of the positioning displacement between the upper buried region 6 and the base contact region 7 in the extending direction. This arrangement can also ensure the current path along at least one of the side walls of the respective trenches 8a to 8d if the upper buried region 6 and the base contact region 7 are shifted from each other in the direction perpendicular to the extending direction, so as to reliably function as the MOSFET.

While the fifth embodiment is illustrated above with the insulated gate semiconductor device in which the base contact region 7 also has the stripe-shaped planar pattern as illustrated in FIG. 36, only the upper buried region 6 may have the stripe-shaped planar pattern while the base contact region 7 is provided into a dotted shape at intervals as illustrated in FIG. 5. This case can also increase the contact area between the upper buried region 6 and the base contact region 7 so as to decrease the ON resistance, as compared with the case in which the upper buried region 6 is provided into the dotted shape at intervals.

Sixth Embodiment

Figure 39:
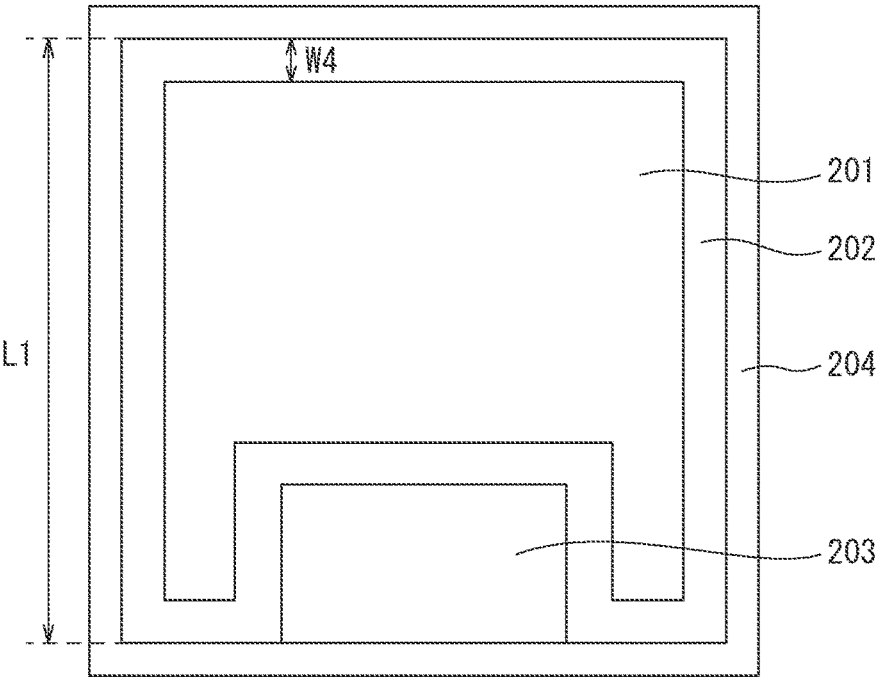
FIG. 39 is a plan view that is an example illustrating an insulated gate semiconductor device according to a sixth embodiment.

An insulated gate semiconductor device according to a sixth embodiment illustrated in FIG. 39 differs from the insulated gate semiconductor device according to the first embodiment in having different cell structures in an active area (201, 202) on the same semiconductor chip. The insulated gate semiconductor device according to the sixth embodiment includes the active area (201, 202), a gate pad 203 located adjacent to the active area (201, 202), and an edge area 204 arranged to surround the active area (201, 202) and the gate pad 203.

The active area (201, 202) includes a middle active area 201, and an edge-side active area 202 provided along the circumference of the middle active area 201. A width W4 of the edge-side active area 202 is set to about 5% to 20% of a length L1 of one side of the active area (201, 202). The edge-side active area 202 is provided along the edge area 204 and the gate pad 203. The middle active area 201 is configured such that the body diode has a lower forward voltage Vf, and the edge-side active area 202 is configured such that the body diode has a higher forward voltage Vf.

Figure 40:
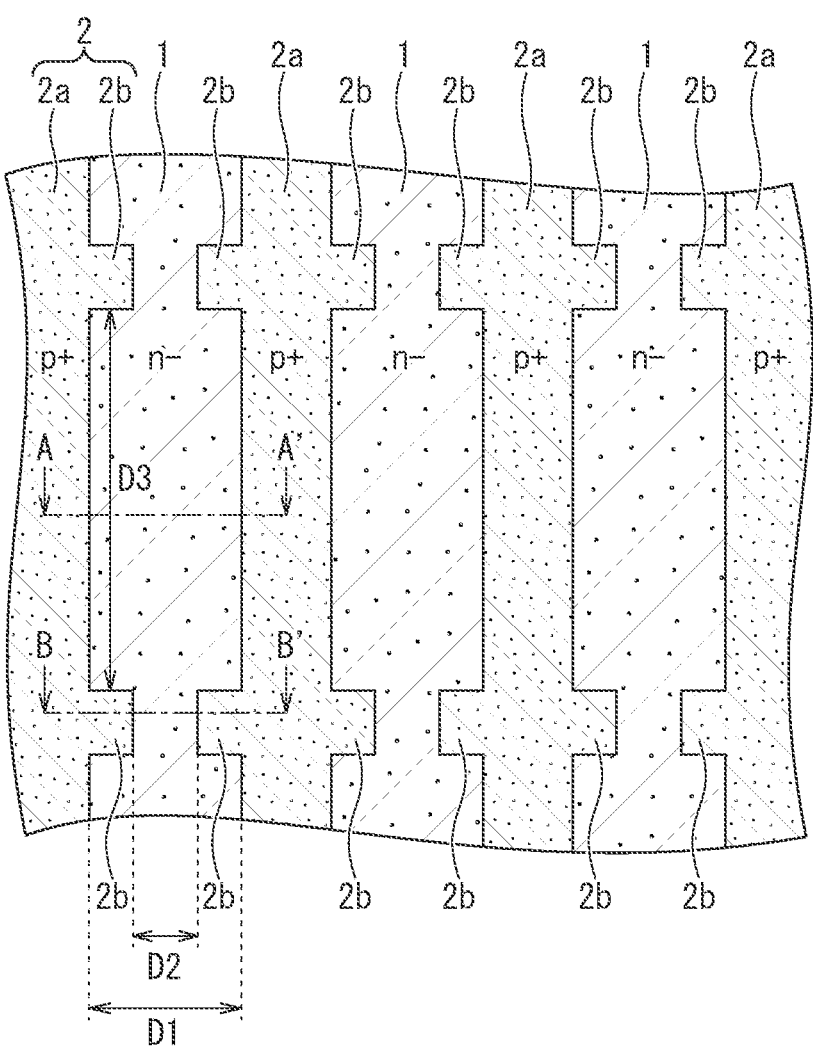
FIG. 40 is a cross-sectional view in the horizontal direction illustrating the insulated gate semiconductor device according to the sixth embodiment corresponding to FIG. 3.
Figure 41:
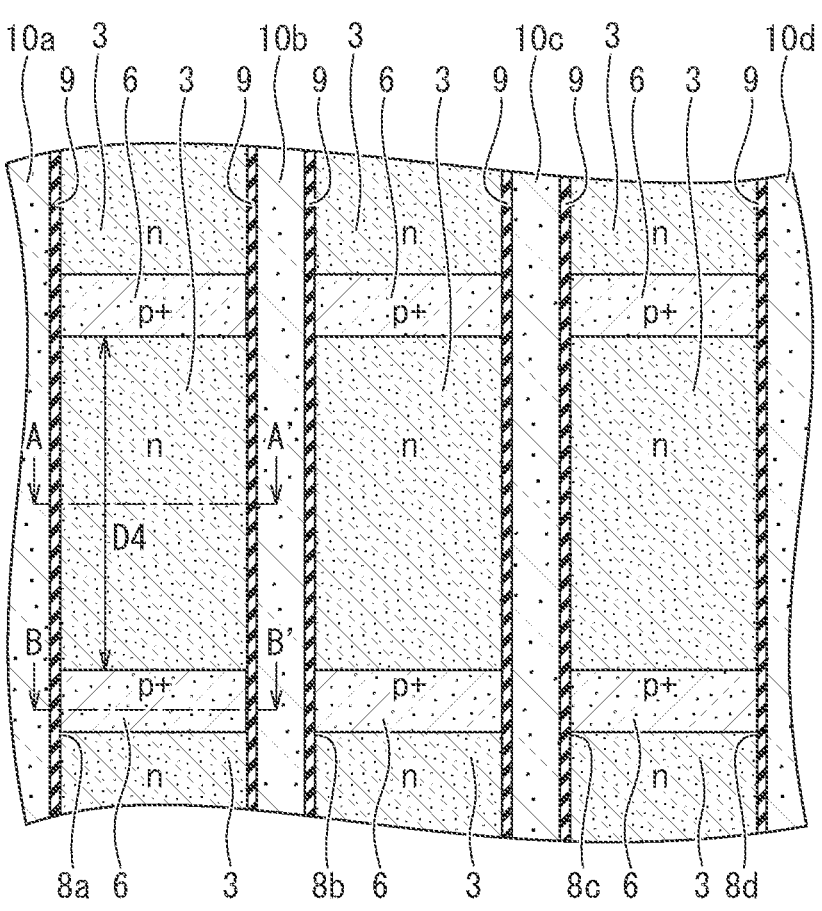
FIG. 41 is a cross-sectional view in the horizontal direction illustrating the insulated gate semiconductor device according to the sixth embodiment corresponding to FIG. 4.
Figure 43:
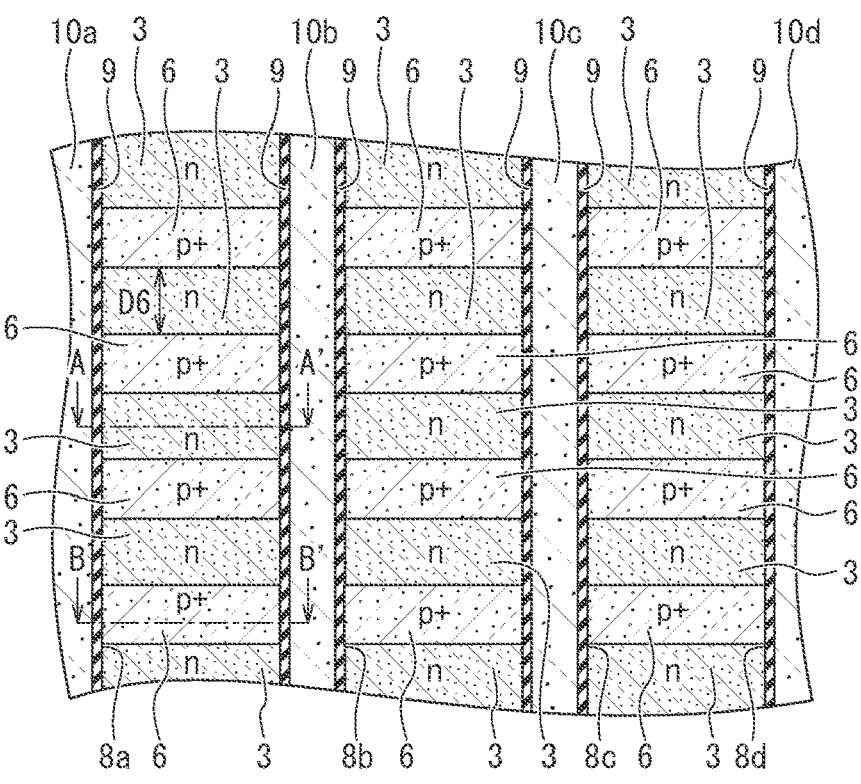
FIG. 43 is another cross-sectional view in the horizontal direction illustrating the insulated gate semiconductor device according to the sixth embodiment corresponding to FIG. 4.

The cross-sectional view illustrating the main part of the middle active area 201 and the edge-side active area 202 conforms to FIG. 1 and FIG. 21. FIG. 40 corresponds to the cross-sectional view (the planar layout) in the horizontal direction as viewed from direction C-C' in FIG. 1 and FIG. 21. FIG. 41 and FIG. 43 each correspond to the cross-sectional view (the planar layout) in the horizontal direction as viewed from direction D-D' in FIG. 1 and FIG. 21. FIG.

Figure 44:
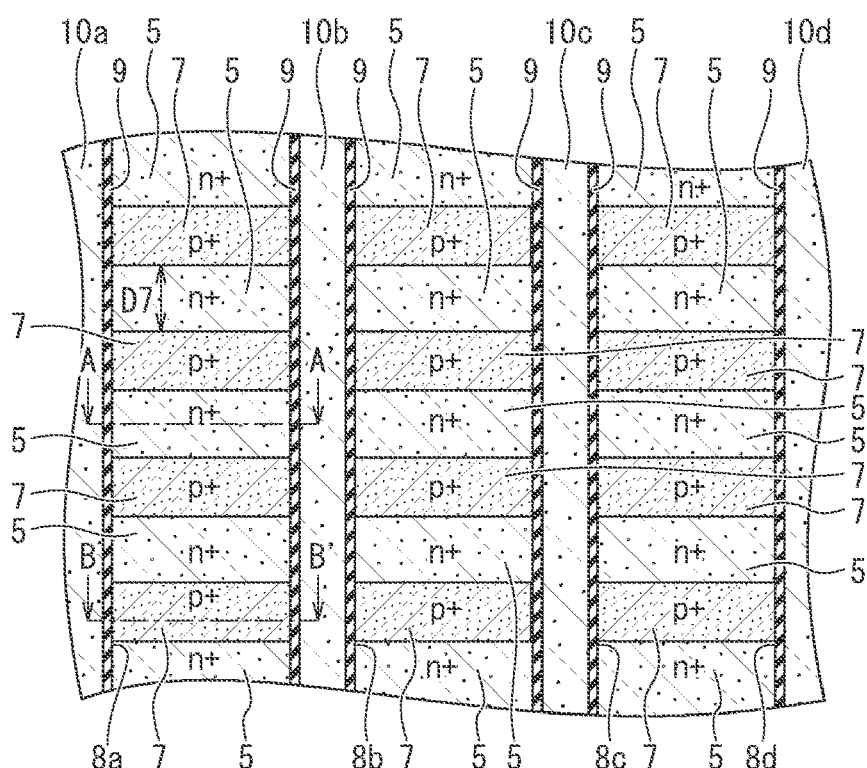
FIG. 44 is another cross-sectional view in the horizontal direction illustrating the insulated gate semiconductor device according to the sixth embodiment corresponding to FIG. 5.

42 and FIG. 44 each correspond to the cross-sectional view (the planar layout) in the horizontal direction as viewed from direction E-E' in FIG. 1 and FIG. 21. The cross-sectional view in the vertical direction as viewed from direction A-A' in FIG. 40 to FIG. 44 conforms to FIG. 1. The cross-sectional view in the vertical direction as viewed from direction B-B' in FIG. 40 to FIG. 44 conforms to FIG. 21.

Figure 42:
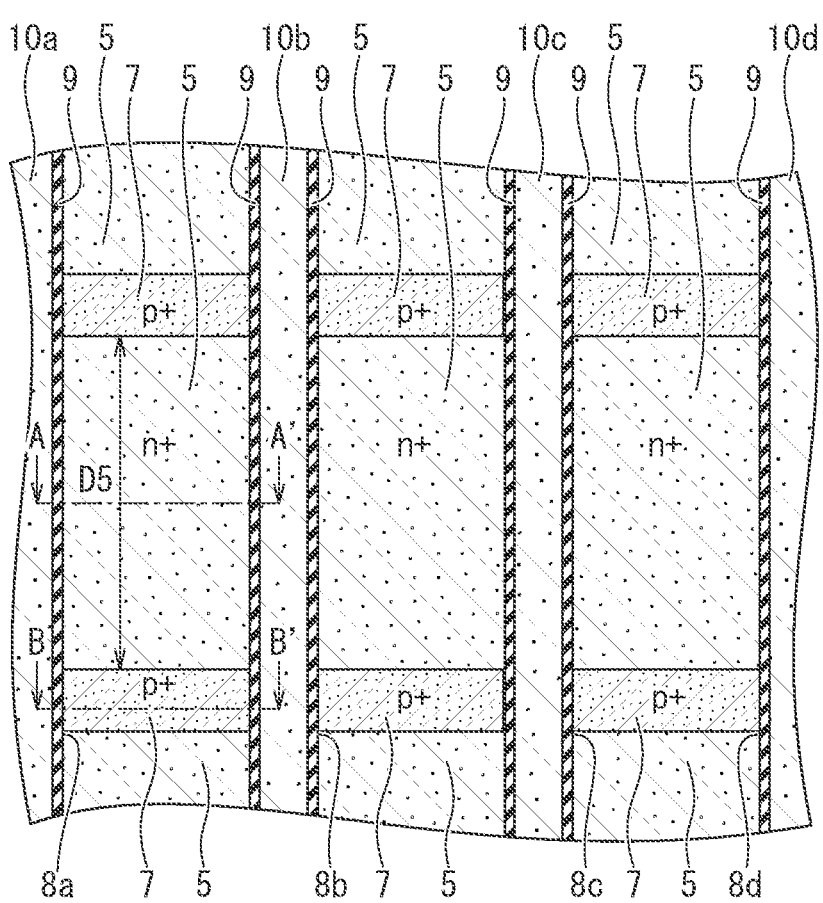
FIG. 42 is a cross-sectional view in the horizontal direction illustrating the insulated gate semiconductor device according to the sixth embodiment corresponding to FIG. 5.

As illustrated in FIG. 40, the projecting parts 2b of the lower buried region 2 are separated from each other in the planar pattern with a gap D3 in the extending direction of the respective trenches 8a to 8d in the edge-side active area 202 illustrated in FIG. 39. As illustrated in FIG. 41, the respective positions of the upper buried region 6 are separated from each other in the planar pattern with a gap D4 that is the same as the gap D3 illustrated in FIG. 40 in the extending direction of the respective trenches 8a to 8d. As illustrated in FIG. 42, the respective positions of the base contact region 7 are separated from each other in the planar pattern with a gap D5 that is the same as the gap D3 illustrated in FIG. 40 and the gap D4 illustrated in FIG. 41 in the extending direction of the respective trenches 8a to 8d. The base contact region 7 has the same shape as the planar pattern of the upper buried region 6.

As illustrated in FIG. 40, the lower buried region 2 in the middle active area 201 illustrated in FIG. 37 has the same structure as in the edge-side active area 202 in the planar pattern in that the connecting parts 2b are separated from each other with the gap D3 in the extending direction of the respective trenches 8a to 8d. As illustrated in FIG. 43, however, the upper buried region 6 has a different structure in the middle active area 201 in which the respective positions are separated from each other with a gap D6 that is narrower than the gap D4 in the edge-side active area 202 illustrated in FIG. 41 in the extending direction of the respective trenches 8a to 8d. In addition, as illustrated in FIG. 44, the base contact region 7 has a structure in which the respective positions are separated from each other in the planar pattern with a gap D7 that is narrower than the gap D5 in the edge-side active area 202 illustrated in FIG. 42 and is the same as the gap D6 illustrated in FIG. 43 in the extending direction of the respective trenches 8a to 8d. The base contact region 7 has the same shape as the planar pattern of the upper buried region 6. The other configurations of the insulated gate semiconductor device according to the sixth embodiment are the same as those of the insulated gate semiconductor device according to the first embodiment, and overlapping explanations are not repeated below.

The edge area 204 and the gate pad 203 illustrated in FIG. 39 tend to cause the body diode to be the ON-state upon the switching operation of the insulated gate semiconductor device according to the sixth embodiment, which easily leads the current of the body diode to be concentrated. The edge-side active area 202 located adjacent to the edge area 204 and the gate pad 203 leads the current of the body diode to be concentrated more easily than the middle active area 201 to cause an excessive current to flow through, increasing the substantial current density of the body diode accordingly. This tends to easily lead to electrical deterioration.

To deal with such a problem, the insulated gate semiconductor device according to the sixth embodiment has the configuration in which the upper buried region 6 and the base contact region 7 have the pitch in the middle active area 201 that is different from that in the edge-side active area 202 on the same semiconductor chip so as to have the rougher (wider) pitch in the edge-side active area 202 than in the middle active area 201. This configuration can increase the forward voltage Vf of the body diode in the edge-side active area 202 more than in the middle active area 201, so as to avoid the electrical deterioration. While the insulated gate semiconductor device according to the sixth embodiment is illustrated above with the case in which the upper buried region 6 and the base contact region 7 each have the pitch that differs between the middle active area 201 and the edge-side active area 202 on the same semiconductor chip, the upper buried region 6 and the base contact region 7 may have the pitch that differs among three or more areas on the same semiconductor chip.

The insulated gate semiconductor device according to the sixth embodiment also has the configuration in which the upper buried region 6 and the base contact region 7 have the same planar pattern in the edge-side active area 202 as illustrated in FIG. 41 and FIG. 42, and the upper buried region 6 and the base contact region 7 have the same planar pattern in the middle active area 201 as illustrated in FIG. 43 and FIG. 44. This configuration enables the use of the common mask upon the manufacture of the insulated gate semiconductor device according to the sixth embodiment to execute both the ion implantation for forming the upper buried region 6 and the ion implantation for forming the base contact region 7, so as to reduce the cost required during the process as compared with a case of using different masks.

The insulated gate semiconductor device according to the sixth embodiment has been illustrated above with the case in which the upper buried region 6 and the base contact region 7 have the pitch that differs between the regions on the same semiconductor chip. Alternatively, the insulated gate semiconductor device according to the sixth embodiment may be configured such that the upper buried region 6 and the base contact region 7 have the pitch that differs between the semiconductor chips implementing the insulated gate semiconductor device according to the sixth embodiment in the semiconductor module equipped with the semiconductor chips. For example, when a chip implementing a Schottky barrier diode (SBD) is externally equipped, the insulated gate semiconductor device according to the sixth embodiment is configured such that the forward voltage Vf of the body diode is increased more than that of the SBD, so as to avoid a transitional flow of the current into the body diode upon the switching operation.

OTHER EMBODIMENTS

While the present invention has been described above by reference to the first to sixth embodiments, it should be understood that the present invention is not intended to be limited to the descriptions and the drawings composing part of this disclosure. Various alternative embodiments, examples, and technical applications will be apparent to those skilled in the art according to this disclosure.

For example, while the first to sixth embodiments have illustrated the MISFET having the insulated gate structures (9, 10a) and (9, 10b) in the trenches 8a and 8b, the present invention is not limited to this case. The present invention can also be applied to insulated gate semiconductor devices having various types of insulated gate structures such as IGBTs that have insulated gate structures in trenches. Such a trench-gate IGBT can have a configuration in which the $n^+$-type source region 5 of the MISFET illustrated in FIG. 1 serves as an emitter region, and a collector region of $p^+$-type is provided on the bottom surface side of the drift layer 1 as a carrier reception region.

While the first to sixth embodiments have illustrated the insulated gate semiconductor device using SiC, the present invention can also be applied to various types of insulated gate semiconductor devices using, other than SiC, a semiconductor (wide band-gap semiconductor) material having a wider band gap than silicon (Si), such as gallium nitride (GaN), diamond, and aluminum nitride (AlN) having a smaller diffusion coefficient than Si.

While the first to sixth embodiments have illustrated the case in which the lower buried region 2, the upper buried region 6, and the base contact region 7 are provided between all of the trenches 8a to 8d adjacent to each other, the lower buried region 2, the upper buried region 6, and the base contact region 7 are not necessarily provided in a part of the regions between the trenches 8a to 8d adjacent to each other. For example, the region between the trenches 8b and 8c adjacent to each other may serve as a mesa region not provided with the lower buried region 2, the upper buried region 6, or the base contact region 7.

The invention claimed is:

1. An insulated gate semiconductor device comprising:
a carrier transport layer of a first conductivity-type;
an injection control region of a second conductivity-type provided on a top surface of the carrier transport layer;
a carrier supply region of the first conductivity-type selectively provided at an upper part of the injection control region;
a base contact region of the second conductivity-type selectively provided at an upper part of the injection control region;
trenches penetrating the injection control region to reach the carrier transport layer;
an insulated gate structure provided inside the respective trenches;
an upper buried region of the second conductivity-type provided inside the carrier transport layer to be in contact with a bottom surface of the injection control region; and
a lower buried region of the second conductivity-type provided inside the carrier transport layer to be in contact with a bottom surface of the upper buried region and a bottom surface of the respective trenches, wherein
the lower buried region is disposed at positions separated from each other via the carrier transport layer between the trenches adjacent to each other, and the bottom surface of the upper buried region is in contact with the carrier transport layer,
the lower buried region includes:
a first lower buried region in contact with a bottom surface of a first trench of the adjacent trenches; and
a second lower buried region in contact with a bottom surface of a second trench of the adjacent trenches, and
an edge of the first lower buried region on the second trench side and an edge of the second lower buried region on the first trench side are in contact with the bottom surface of the upper buried region.

2. The insulated gate semiconductor device of claim 1, wherein the lower buried region has corner parts defined by side surfaces and a bottom surface at edges separated to be opposed to each other.

3. The insulated gate semiconductor device of claim 1, wherein the base contact region is provided in a middle between the trenches adjacent to each other.

4. The insulated gate semiconductor device of claim 1, wherein side surfaces on both sides of the base contact region are separated from the trenches adjacent to each other.

5. The insulated gate semiconductor device of claim 1, wherein side surfaces on both sides of the upper buried region are separated from the trenches adjacent to each other.

6. The insulated gate semiconductor device of claim 1, wherein the upper buried region has a narrower width than the base contact region.

7. The insulated gate semiconductor device of claim 1, wherein the upper buried region has a width that is greater than a gap between the respective positions of the lower buried region separated from each other.

8. The insulated gate semiconductor device of claim 1, wherein the base contact region, the injection control region, the upper buried region, and the lower buried region straightly overlap with each other in a depth direction of the trenches.

9. The insulated gate semiconductor device of claim 1, wherein the carrier transport layer includes a drift layer of the first conductivity-type, and a current spreading layer of the first conductivity-type provided on the drift layer.

10. The insulated gate semiconductor device of claim 1, wherein:

the trenches adjacent to each other extend parallel to each other in a planar pattern; and the lower buried region includes stripe parts extending in a direction parallel to the trenches, and projecting parts connected to the stripe parts and projecting in a direction perpendicular to the extending direction of the stripe parts.

11. The insulated gate semiconductor device of claim 1, wherein:

the trenches adjacent to each other extend parallel to each other in a planar pattern; and the lower buried region is provided to have stripe parts extending parallel to the trenches, and includes a part that is in contact with the upper buried region and has a greater width than a part not in contact with the upper buried region.

12. The insulated gate semiconductor device of claim 1, wherein side surfaces on both sides of the base contact region are in contact with the respective trenches adjacent to each other.

13. The insulated gate semiconductor device of claim 1, wherein side surfaces on both sides of the upper buried region are in contact with the respective trenches adjacent to each other.

14. The insulated gate semiconductor device of claim 1, further comprising a high-concentration region of the first conductivity-type provided on bottom surfaces of end parts of the positions of the lower buried region opposed to each other.

15. The insulated gate semiconductor device of claim 1, wherein the base contact region and the upper buried region are provided at positions shifted from each other in a depth direction of the trenches.

16. The insulated gate semiconductor device of claim 1, wherein:

the trenches adjacent to each other extend parallel to each other in a planar pattern; and the upper buried region has a stripe-shaped planar pattern extending in a direction in which the trenches extend.

17. The insulated gate semiconductor device of claim 16, wherein the base contact region has a stripe-shaped planar pattern extending in the extending direction of the trenches.

18. The insulated gate semiconductor device of claim 1, wherein:

the trenches adjacent to each other extend parallel to each other in a planar pattern;

the base contact region and the upper buried region are located at positions overlapping with each other intermittently in a direction in which the trenches extend; and a gap between the positions at which the base contact region and the upper buried region are located differs among a plurality of active areas.

19. An insulated gate semiconductor device comprising:

a carrier transport layer of a first conductivity-type;

an injection control region of a second conductivity-type provided on a top surface of the carrier transport layer;

a carrier supply region of the first conductivity-type selectively provided at an upper part of the injection control region;

a base contact region of the second conductivity-type selectively provided at an upper part of the injection control region;

trenches penetrating the injection control region to reach the carrier transport layer;

an insulated gate structure provided inside the respective trenches;

an upper buried region of the second conductivity-type provided inside the carrier transport layer to be in contact with a bottom surface of the injection control region; and a lower buried region of the second conductivity-type provided inside the carrier transport layer to be in contact with a bottom surface of the upper buried region and a bottom surface of the respective trenches, wherein the lower buried region is provided as a first lower buried region and a second lower buried region spaced apart from each other via the carrier transport layer between adjacent trenches, a portion of the carrier transport layer is interposed between the first lower buried region and the second lower buried region and extends from the first lower buried region to the second lower buried region, and the upper buried region is provided over and covers the entire portion of the carrier transport layer.

* * * * *